(12) United States Patent
Lee et al.

(10) Patent No.: US 11,545,526 B2
(45) Date of Patent: Jan. 3, 2023

(54) IMAGE SENSORS

(71) Applicant: Samsung Electronics Co., Ltd., Suwon-si (KR)

(72) Inventors: Gwideok Ryan Lee, Hwaseong-si (KR); Jaekyu Lee, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/386,821

(22) Filed: Jul. 28, 2021

(65) Prior Publication Data

US 2022/0077237 A1 Mar. 10, 2022

(30) Foreign Application Priority Data

Sep. 8, 2020 (KR) .................. 10-2020-0114869

(51) Int. Cl.
 *H01L 27/30* (2006.01)
(52) U.S. Cl.
 CPC .............................. *H01L 27/307* (2013.01)
(58) Field of Classification Search
 CPC .................................................. H01L 27/307
 See application file for complete search history.

(56) References Cited

U.S. PATENT DOCUMENTS

| | | | |
|---|---|---|---|
| 9,426,399 B2 | 8/2016 | Yamaguchi |
| 9,548,327 B2 | 1/2017 | Inoue et al. |
| 9,704,899 B2 | 7/2017 | Kurokawa |
| 9,748,291 B2 | 8/2017 | Ikeda et al. |
| 9,917,140 B2 | 3/2018 | Sato |
| 10,020,336 B2 | 7/2018 | Ikeda et al. |
| 10,468,451 B2 | 11/2019 | Togashi et al. |
| 2020/0119097 A1 | 4/2020 | Lee et al. |

FOREIGN PATENT DOCUMENTS

KR 20200040516 A * 4/2020

* cited by examiner

*Primary Examiner* — Monica D Harrison
*Assistant Examiner* — Molly K Reida
(74) *Attorney, Agent, or Firm* — Harness, Dickey & Pierce, P.L.C.

(57) ABSTRACT

An image sensor includes a substrate including a first surface and a second surface, a first transmission gate electrode on the first surface of the substrate, a storage node on the first surface of the substrate and including a first storage gate electrode isolated from direct contact with the first transmission gate electrode, a dielectric layer on the first storage gate electrode, and a semiconductor layer on the dielectric layer. The image sensor may include a first cover insulating layer on the semiconductor layer and vertically overlapping the first transmission gate electrode, and an organic photoelectric conversion layer on an upper surface of the semiconductor layer and an upper surface of the first cover insulating layer.

20 Claims, 18 Drawing Sheets

IV-IV'

V-V'

VIII–VIII'

IX-IX'

IMAGE SENSORS

CROSS-REFERENCE TO RELATED APPLICATION

This application is based on and claims priority under 35 U.S.C. § 119 to Korean Patent Application No. 10-2020-0114869, filed on Sep. 8, 2020, in the Korean Intellectual Property Office, the disclosure of which is incorporated by reference herein in its entirety.

BACKGROUND

The inventive concepts relates to image sensors, and more particularly, to image sensors including an organic photoelectric conversion layer.

An image sensor is a device that captures images and converts the images into electrical signals. The image sensor includes image sensing pixels that receive incident light, convert the incident light into electrical signals, and include photoelectric conversion regions. In the case of a silicon photoelectric conversion region, a light absorption region of a photoelectric conversion region decreases as a size of the image sensing pixel decreases, and thus, sensitivity of the image sensor may degrade.

SUMMARY

The inventive concepts provides an image sensor capable of preventing a current leakage of an organic photoelectric conversion device or decreasing reset noise. In such an image sensor, the silicon photoelectric conversion region of the image sensor may be replaced with a photoelectric conversion region including an organic material.

According to some example embodiments of the inventive concepts, an image sensor may include a substrate including a first surface and a second surface, a first transmission gate electrode on the first surface of the substrate, and a storage node on the first surface of the substrate. The storage node may include a first storage gate electrode isolated from direct contact with the first transmission gate electrode, a dielectric layer on the first storage gate electrode, and a semiconductor layer on the dielectric layer. The image sensor may further include a first cover insulating layer on the semiconductor layer, the first cover insulating layer overlapping the first transmission gate electrode in a vertical direction that extends perpendicular to the first surface of the substrate. The image sensor may further include an organic photoelectric conversion layer on an upper surface of the semiconductor layer and an upper surface of the first cover insulating layer.

According to some example embodiments of the inventive concepts, an image sensor may include a substrate including a first surface and a second surface, a first transmission gate electrode on the first surface of the substrate, and a storage node on the first surface of the substrate. The storage node may include a first storage gate electrode isolated from direct contact with the first transmission gate electrode, a dielectric layer on the first storage gate electrode, and a semiconductor layer on the dielectric layer. The image sensor may further include a cover insulating layer on the semiconductor layer. The cover insulating layer may include one or more surfaces at least partially defining an opening in the cover insulating layer that overlaps the first storage gate electrode in a vertical direction that extends perpendicular to the first surface of the substrate and at least exposes the first storage gate electrode from the cover insulating layer in the vertical direction. The image sensor may further include an organic photoelectric conversion layer on the semiconductor layer and the cover insulating layer. The organic photoelectric conversion layer may fill the opening of the cover insulating layer. The first transmission gate electrode may be covered by the cover insulating layer.

According to some example embodiments of the inventive concepts, an image sensor may include a substrate including a first surface and a second surface, a photoelectric conversion region in the substrate, a first transmission gate electrode on the first surface of the substrate, and a storage node on the first surface of the substrate. The storage node may include a first storage gate electrode isolated from direct contact with the first transmission gate electrode, a dielectric layer on the first storage gate electrode, and a semiconductor layer on the dielectric layer. The image sensor may further include a cover insulating layer on the semiconductor layer. The cover insulating layer may include one or more surfaces at least partially defining an opening in the cover insulating layer that overlaps the first storage gate electrode in a vertical direction that extends perpendicular to the first surface of the substrate and at least exposes the first storage gate electrode from the cover insulating layer in the vertical direction. The image sensor may further include an organic photoelectric conversion layer on the semiconductor layer and the cover insulating layer. The organic photoelectric conversion layer may fill the opening of the cover insulating layer. The image sensor may further include a second transmission gate electrode on the second surface of the substrate. The first transmission gate electrode may not overlap the opening of the cover insulating layer in the vertical direction.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Figure 1:
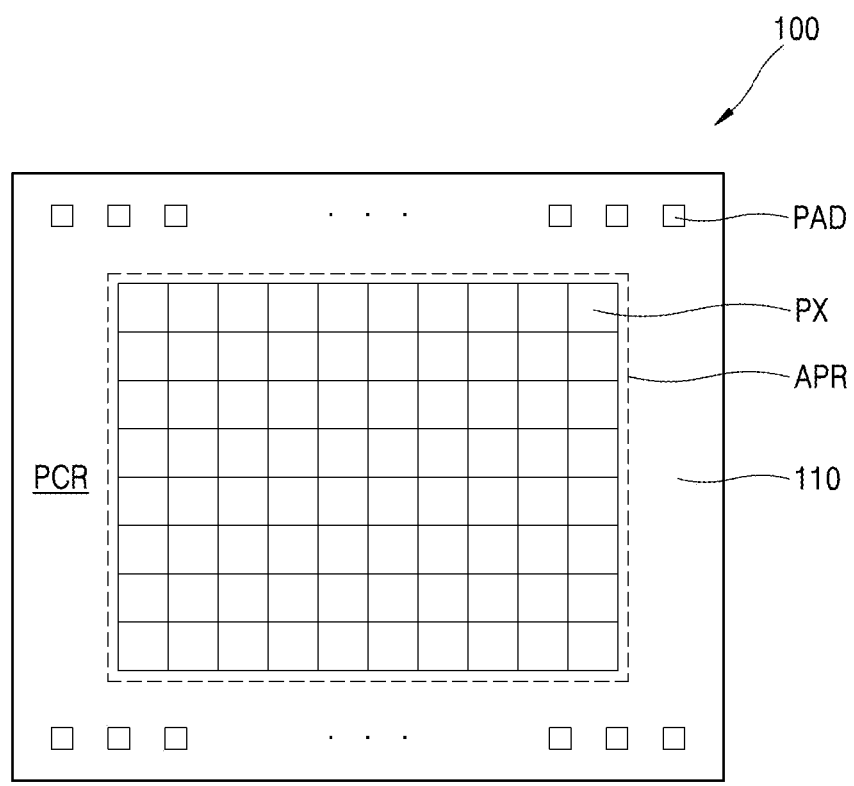
FIG. 1 is a schematic layout of an image sensor according to some example embodiments.

Hereinafter, one or more example embodiments of the inventive concepts will be described in detail with reference to the attached drawings.

It will be understood that when an element is described to be "on" another element, the element may be above, beneath, or to the side of (e.g., horizontally adjacent to) the other element. It will further be understood that when an element is described to be "on" another element, the element may be "directly on" the other element so as to be in direct contact with the other element or may be "indirectly on" the other element so as to be isolated from direct contact with the other element by one or more interposing spaces and/or structures. Singular expressions include plural expressions unless the context clearly indicates otherwise.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%)).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%)).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "the same" as or "equal" to other elements may be "the same" as or "equal" to or "substantially the same" as or "substantially equal" to the other elements and/or properties thereof. Elements and/or properties thereof that are "substantially the same" as or "substantially equal" to other elements and/or properties thereof will be understood to include elements and/or properties thereof that are the same as or equal to the other elements and/or properties thereof within manufacturing tolerances and/or material tolerances. Elements and/or properties thereof that are the same or substantially the same as other elements and/or properties thereof may be structurally the same or substantially the same, functionally the same or substantially the same, and/or compositionally the same or substantially the same.

It will be understood that elements and/or properties thereof described herein as being the "substantially" the same encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

An element (e.g., structure, surface, direction, etc.) described as being "in parallel" with another element may be interchangeably referred to as "extending in parallel" with the other element. An element (e.g., structure, surface, direction, etc.) described as being "perpendicular" to another element may be interchangeably referred to as "extending perpendicular" with the other element.

Figure 2:
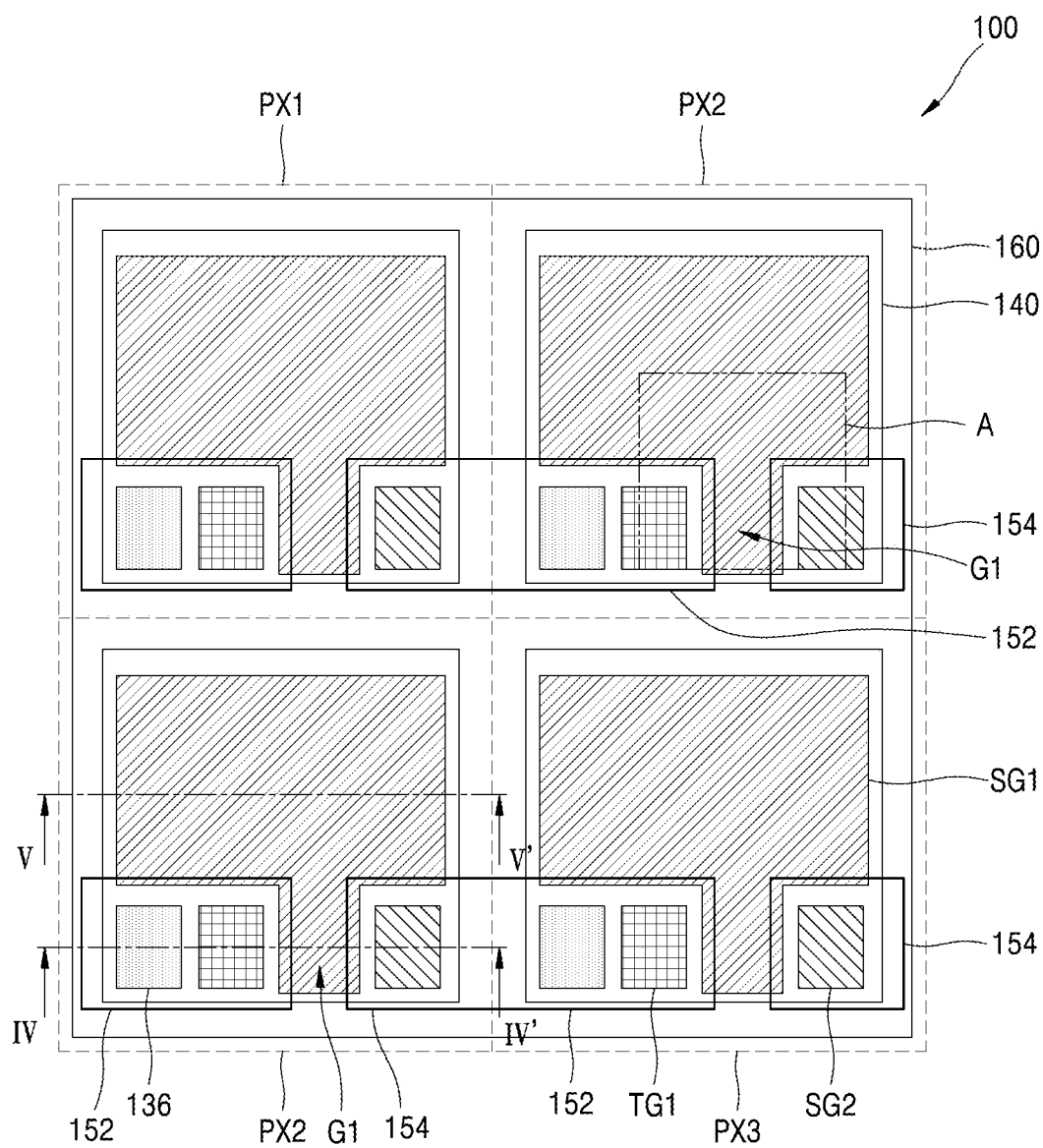
FIG. 2 is a layout illustrating a portion of an active pixel region of FIG. 1.
Figure 3:
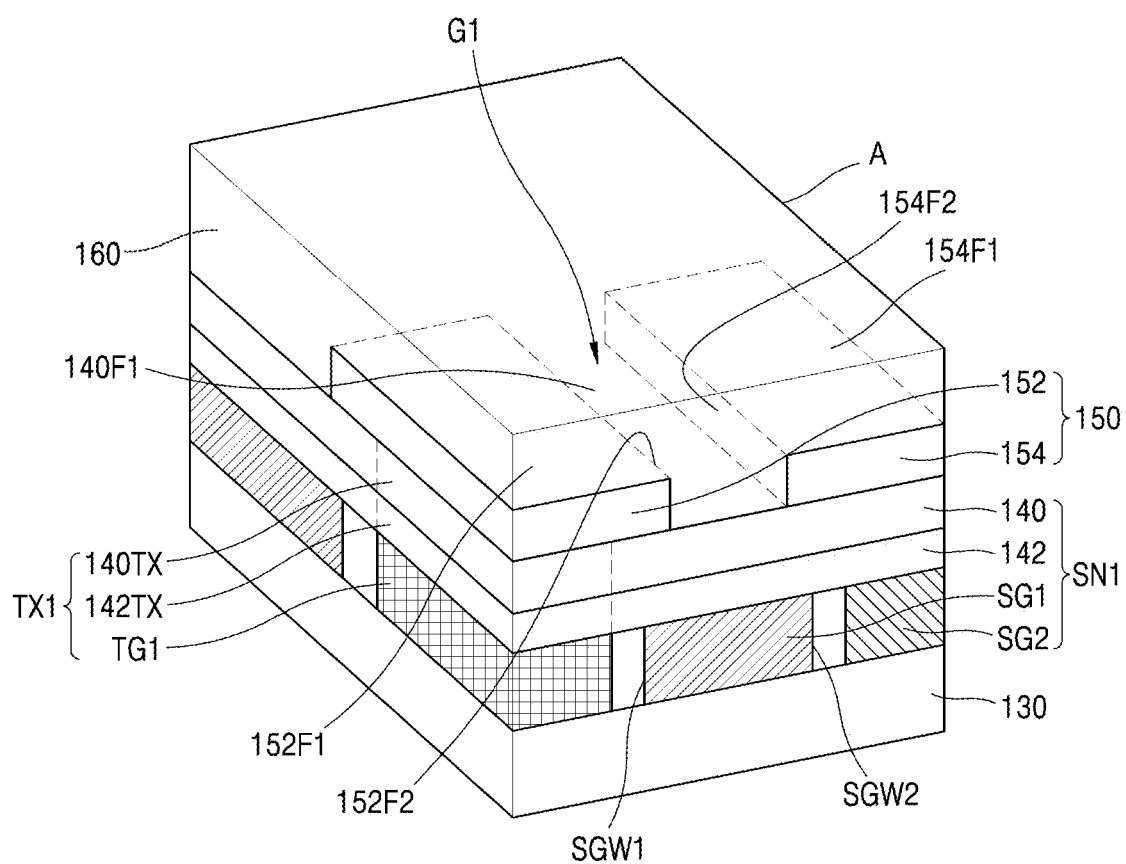
FIG. 3 is a perspective view of a region A of FIG. 2.
Figure 4:
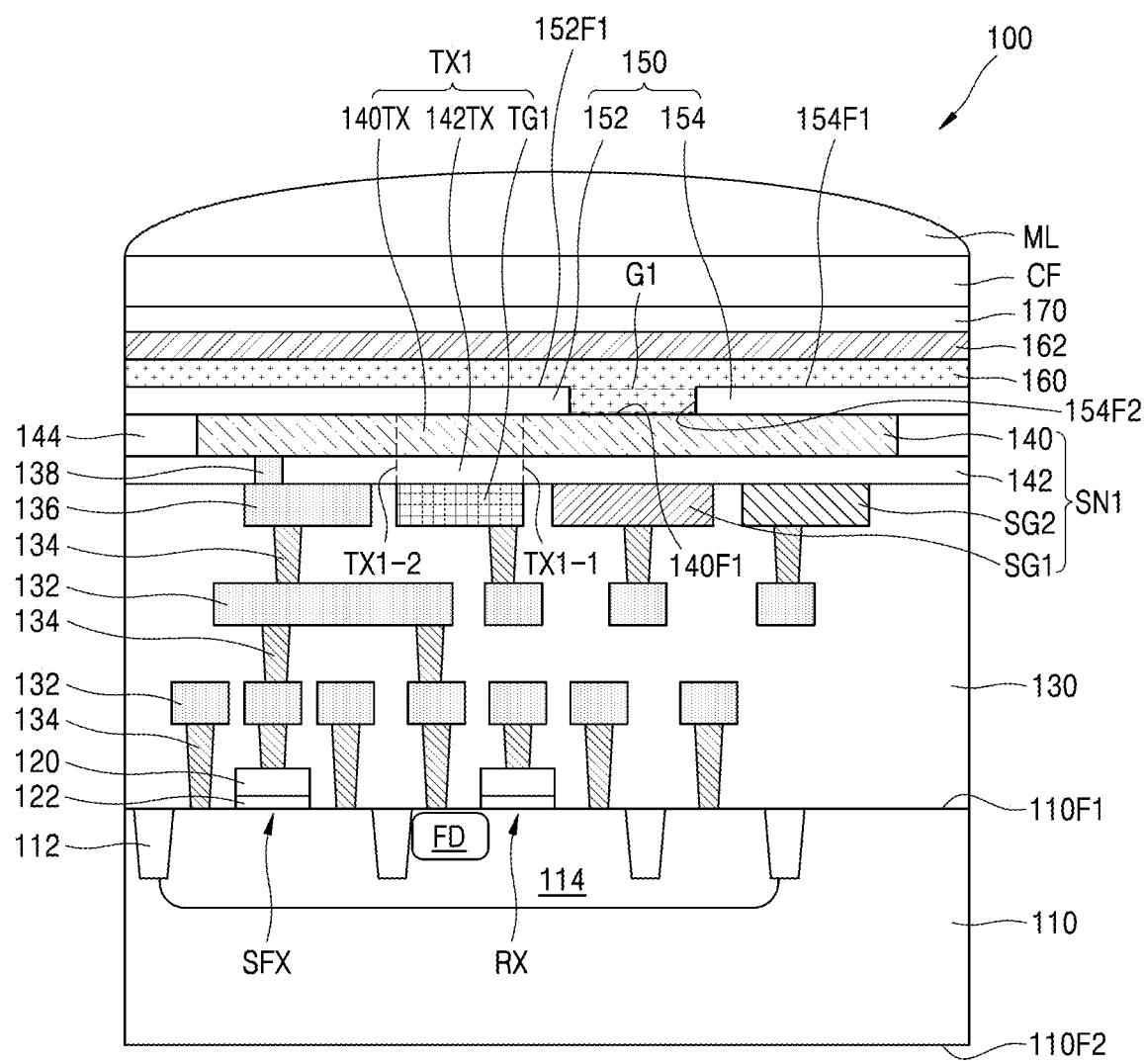
FIG. 4 is a cross-sectional view taken along a line IV-IV' of FIG. 2.
Figure 5:
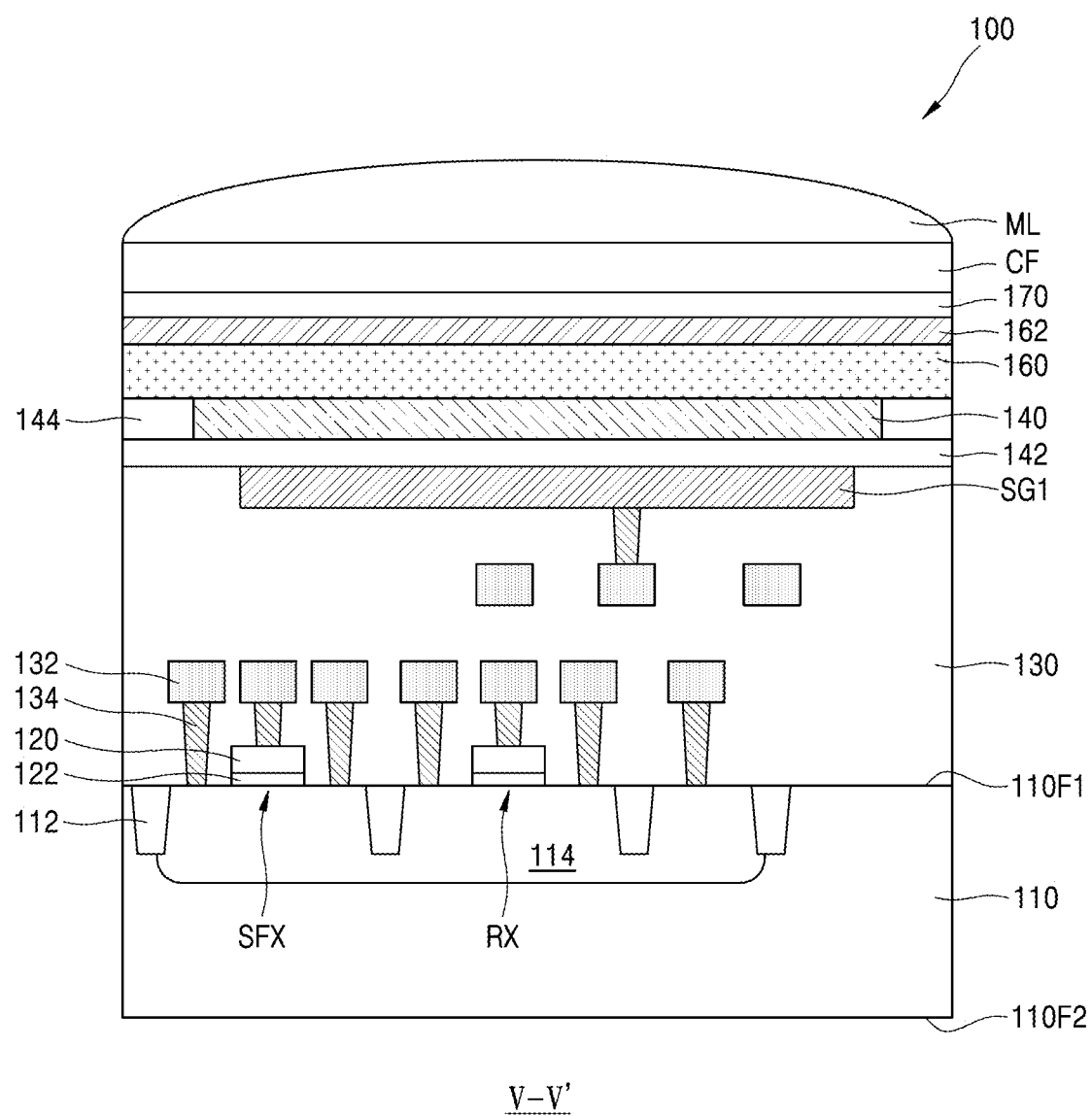
FIG. 5 is a cross-sectional view taken along a line V-V' of FIG. 2.
Figure 6:
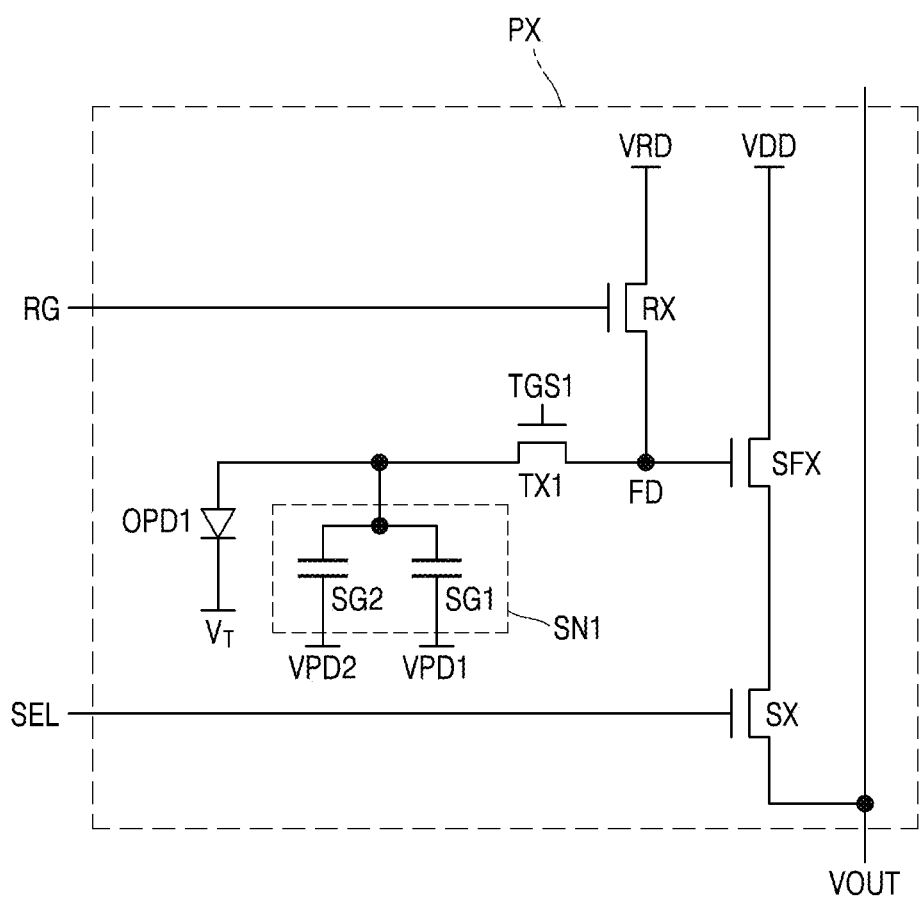
FIG. 6 is a readout circuit of one active pixel of FIG. 2.

FIG. 1 is a schematic layout of an image sensor 100 according to some example embodiments. FIG. 2 is a layout illustrating a portion of an active pixel region APR of FIG. 1. FIG. 3 is a perspective view of a region A of FIG. 2. FIG. 4 is a cross-sectional view taken along a line IV-IV' of FIG. 2. FIG. 5 is a cross-sectional view taken along a line V-V' of FIG. 2. FIG. 6 is a readout circuit of one active pixel PX of FIG. 2.

Referring to FIGS. 1 to 6, the image sensor 100 may be an image sensor of a front-side illumination (FSI) type that includes an organic photoelectric conversion region. The image sensor 100 may include a substrate 110 including the active pixel region APR and a driving circuit region PCR.

The active pixel region APR may be a region where active pixels PX are arranged. The driving circuit region PCR may be a region where a driving transistor (not shown) for driving the active pixels PX are arranged. In the driving circuit region PCR, pads PAD may be arranged. In a plan view, the driving circuit regions PCR may be arranged on both sides of the active pixel region APR or may surround the active pixel region APR.

The driving transistors may be CMOS transistors for providing uniform signals to respective active pixels PX in the active pixel region APR or controlling output signals from respective active pixels PX. For example, the above transistor may form various types of logic circuits such as a timing generator, a row decoder, a row driver, a correlated double sampler (CDS), an analog to digital converter (ADC), a latch, and a column decoder, but some example embodiments are not limited thereto.

As shown in FIG. 2, the active pixels PX may each include a first active pixel PX1, a second active pixel PX2, and a third active pixel PX3. The first active pixel PX1 may be a region where light in a first wavelength range is sensed, for example, a region where red light is sensed. The second active pixel PX2 may be a region where light in a second wavelength range is sensed, for example, a region where green light is sensed. The third active pixel PX3 may be a region where light in a third wavelength range is sensed, for example, a region where blue light is sensed.

The substrate 110 may include a first surface 110F1 and a second surface 110F2 that are opposite to each other (e.g., are opposite surfaces of the substrate 110). The first surface 110F1 of the substrate 110 may be a surface to which light is incident. The substrate 110 may include a P-type semiconductor substrate. For example, the substrate 110 may be a P-type silicon substrate. In some example embodiments, the substrate 110 may include a P-type bulk substrate and a P-type or an N-type epitaxial layer grown on the P-type bulk substrate. In some example embodiments, the substrate 110 may include silicon germanium, indium antimonide, a lead telluride compound, indium arsenide, indium phosphide, gallium arsenide, or gallium antimonide. In some example embodiments, the substrate 110 may include an organic plastic substrate.

In some example embodiments, the substrate 110 may include a floating diffusion region FD at least partially within the substrate 110, such that the floating diffusion region FD is located partially or entirely between the opposite first and second surfaces 110F1 and 110F2 of the substrate 110.

Device isolation layers 112 may be disposed in portions of the substrate 110 that are adjacent to the first surface 110F1 of the substrate 110, and a well region 114 defined by the device isolation layers 112 may be disposed in the substrate 110. For example, the well region 114 may be a region doped with p-type impurities.

On the first surface 110F1 of the substrate 110, a gate electrode 120, an interlayer insulating layer 130, a storage node SN1, a first transmission transistor TX1, first and second cover insulating layers 152 and 154, an organic photoelectric conversion layer 160, an upper electrode 162, a color filter CF, a micro-lens ML may be disposed.

On the first surface 110F1 of the substrate 110, a stack structure including a gate insulating layer 122 and the gate electrode 120 may be disposed. The gate electrode 120 may include a gate electrode of a reset transistor RX, a gate electrode of a source follower transistor SFX, and a gate electrode of a selection transistor (not shown). Impurity regions (not shown) may be further formed in the substrate 110 on both sides of the gate electrode 120.

On the first surface 110F1 of the substrate 110, wire layers 132 and contacts 134, which are electrically connected to the gate electrode 120 and the impurity regions, may be arranged. The wire layers 132 may be layers arranged at different vertical levels. The interlayer insulating layer 130 may cover the gate electrode 120, the wire layers 132, and the contacts 134. The interlayer insulating layer 130 may have a stack structure including insulating layers (not shown), and respective insulating layers may surround the wire layers 132 and the contacts 134.

The storage node SN1 may be arranged on (e.g., above) the interlayer insulating layer 130. As shown, the storage node SN1 may be on (e.g., indirectly above) the first surface 110F1 of the substrate 110. The storage node SN1 may include a first storage gate electrode SG1, a second storage gate electrode SG2, a dielectric layer 142 on at least the first storage gate electrode SG1, and a semiconductor layer 140 on at least the dielectric layer 142, for example such that the dielectric layer 142 is between at least the first storage gate electrode SG1 and the semiconductor layer 140 in the vertical direction that extends perpendicular to the first surface 110F1 of the substrate 110. In some example embodiments, the second storage gate electrode SG2 may be omitted.

In some example embodiments, the first storage gate electrode SG1 and the second storage gate electrode SG2 may be apart from each other at the same vertical level. It will be understood that the second storage gate electrode SG2 may be isolated from direct contact with both of the first transmission gate electrode TG1 and the first storage gate electrode SG1. The first storage gate electrode SG1 may include a first side surface SGW1 and a second side surface SGW2 that is opposite to the first side surface SGW1, and the second storage gate electrode SG2 may be adjacent to the second side surface SGW2 of the first storage gate electrode SG1. In some examples, in the plan view, an area of the first storage gate electrode SG1 may be two to a hundred times an area of the second storage gate electrode SG2, but some example embodiments are not limited thereto.

As described herein, elements that are described to be "apart" from each other, separated from each other, or the like will be understood to be isolated from direct contact with each other.

As shown in at least FIGS. 2 and 4, the first storage gate electrode SG1 may be isolated from direct contact with the first transmission gate electrode TG1 (e.g., by at least a portion of the interlayer insulating layer 130).

In some example embodiments, the first storage gate electrode SG1 and the second storage gate electrode SG2 may each include at least one of titanium, tantalum, tungsten, ruthenium, titanium nitride, tantalum nitride, tungsten nitride, aluminum (Al), magnesium (Mg), silver (Ag), nickel (Ni), cobalt (Co), platinum (Pt), copper (Cu), and gold (Au). In some example embodiments, the first storage gate electrode SG1 and the second storage gate electrode SG2 may each include at least one of indium tin oxide (ITO), indium zinc oxide (IZO), zinc oxide (ZnO), tin oxide (SnO), antimony-doped tin oxide (ATO), Al-doped zinc oxide (AlTO), and fluorine-doped tin oxide (FTO).

The dielectric layer 142 may cover both the first storage gate electrode SG1 and the second storage gate electrode SG2. In some example embodiments, the dielectric layer 142 may include any one of aluminum oxide, silicon nitride, silicon oxide, or a combination thereof.

The semiconductor layer 140 may be disposed on the dielectric layer 142. The semiconductor layer 140 may vertically overlap the first storage gate electrode SG1 and the second storage gate electrode SG2. In some example embodiments, the semiconductor layer 140 and the dielectric layer 142 may function as storage structures in which photo-charges generated by the organic photoelectric conversion layer 160 are accumulated. For example, when a first voltage VPD1 is applied to the first storage gate electrode SG1 and when an upper electrode voltage $V_T$ is applied to the upper electrode 162, the photo-charges generated by the organic photoelectric conversion layer 160 may be stored in an interface between the semiconductor layer 140 and the dielectric layer 142 because of light incident to the organic photoelectric conversion layer 160.

In some example embodiments, the semiconductor layer 140 may include at least one of CdSe, CdS, ZnO, $SnO_2$, $MoS_2$, $TiO_2$, $Fe_2O_3$, $WO_3$, InGaZnO, ZnO—$Rh_2O_3$, $In_2O_3$, ZnInO, InGaO, InZnO, and ZnSnO. In some example embodiments, the semiconductor layer 140 may include an organic semiconductor material such as Dibenzothiopheno [6,5-b:6',5'-f]thieno[3,2-b]thiophene (DBTTT).

An insulating fence 144 may be further disposed between the semiconductor layer 140 in one active pixel PX and the semiconductor layer 140 in a neighboring active pixel PX. The insulating fence 144 may have an upper surface that is at the same level as an upper surface of the semiconductor layer 140.

In some example embodiments, the image sensor 100 (e.g., the storage node SN1) is configured to enable the first voltage VPD1 to be applied to the first storage gate electrode SG1, and a second voltage VPD2, which is different (e.g., different in magnitude, positivity or negativity, etc.) from the first voltage VPD1, to be applied to the second storage gate electrode SG2 independently of the first voltage VPD1 being applied to the first storage gate electrode SG1. In some example embodiments, the first voltage VPD1 may be a positive voltage, and the second voltage VPD2 may be a ground or negative voltage. In some example embodiments, the first voltage VPD1 may be a positive voltage, and the second voltage VPD2 may be a positive voltage lower than the first voltage VPD1. However, some example embodiments are not limited thereto. As the second voltage VPD2, which is different from the voltage applied to the first storage gate electrode SG1, is applied to the second storage gate electrode SG2, a full well capacity may be secured in the storage node SN1 while the photo-charges generated by the organic photoelectric conversion layer 160 are accumulated. Also, as the second voltage VPD2, which is different from the voltage applied to the first storage gate electrode SG1, is applied to the second storage gate electrode SG2, the transmission of the photo-charges may be accelerated by a potential gradient with the first storage gate electrode SG1 while a signal is transmitted from the storage node SN1 through the first transmission transistor TX1. Accordingly, the second storage gate electrode SG2 may form a potential gradient with the first storage gate electrode SG1 in response to the first transmission transistor TX1 being turned on and photo-charges stored in the storage node SN1 being transmitted to the floating diffusion region FD (e.g., via the first transmission transistor). In some example embodiments, the second storage gate electrode SG2 may form the potential gradient with the first storage gate electrode SG1 in response to both 1) the first voltage VPD1 being applied to the first storage gate electrode SG1 and the different, second voltage VPD2 being applied to the second storage gate electrodes SG2 independently of the first storage gate electrode, and 2) the first transmission transistor TX1 being turned on and photo-charges stored in the storage node SN1 being transmitted to the floating diffusion region FD (e.g., via the first transmission transistor).

The first transmission transistor TX1 may be further disposed on the interlayer insulating layer 130. The first transmission transistor TX1 may include a first transmission gate electrode TG1, a gate dielectric layer 142TX, and a channel layer 140TX.

The first transmission gate electrode TG1 may be disposed on (e.g., indirectly above) the first surface 110F1 of the substrate. The first transmission gate electrode TG1 may be disposed at the same vertical level as the first storage gate electrode SG1 and the second storage gate electrode SG2. The first transmission gate electrode TG1 may be adjacent to the first side surface SGW1 of the first storage gate electrode SG1. For example, the first side surface SGW1 may be between the first transmission gate electrode TG1 and the second side surface SGW2, and the second side surface SGW2 may be between the first side surface SGW1 and the second storage gate electrode SG2. In some example embodiments, in the plan view, the area of the first storage gate electrode SG1 may be two to a hundred times an area of the first transmission gate electrode TG1 (e.g., the magnitude of the cross-sectional and/or surface area of the first storage gate electrode SG1 in a horizontal plane extending parallel to the first surface 110F1 of the substrate 110 may be two to a hundred time greater in magnitude than the magnitude of the cross-sectional and/or surface area of the first transmission gate electrode TG1 in the horizontal plane extending parallel to the first surface 110F1 of the substrate 110), but some example embodiments are not limited thereto.

As described herein, a "vertical level" of an element may refer to a distance of some or all of the element from the first surface 110F1 of the substrate 110 in a vertical direction, where the vertical direction extends perpendicular to the first surface 110F1 of the substrate 110.

The gate dielectric layer 142TX may be a portion of the dielectric layer 142 that vertically overlaps the first transmission gate electrode TG1, and the channel layer 140TX may be a portion of the semiconductor layer 140 that vertically overlaps the first transmission gate electrode TG1.

A storage wire layer 136 may be disposed adjacent to the first transmission gate electrode TG1, and a storage contact 138 may be disposed on the storage wire layer 136. The storage contact 138 may be electrically connected to the semiconductor layer 140 through the dielectric layer 142. When the first transmission transistor TX1 including the first transmission gate electrode TG1, the gate dielectric layer 142TX, and the channel layer 140TX is turned on, the photo-charges stored in the storage node SN1 (e.g., photo-charges stored in the semiconductor layer 140) may be transmitted to the floating diffusion region FD and the source follower transistor SFX through the storage contact 138 and the storage wire layer 136.

A cover insulating layer 150 may be disposed on the semiconductor layer 140. The cover insulating layer 150 may include a first cover insulating layer 152 and a second cover insulating layer 154. The first cover insulating layer 152 may vertically overlap the first transmission gate electrode TG1 and the storage wire layer 136. Restated, the first cover insulating layer 152 may overlap at least one of the first transmission gate electrode TG1 or the storage wire layer 136 in a vertical direction that extends perpendicular to the first surface 110F1 of the substrate 110. The second cover insulating layer 154 may vertically overlap (e.g., overlap in the vertical direction) the second storage gate electrode SG2.

As described herein, elements that "vertically overlap" and/or are "covered" by each other may overlap in the vertical direction. As described herein, elements that do not "vertically overlap," are "exposed from," and/or are not "covered" by each other may at least partially not overlap in the vertical direction. As described herein the vertical direction may extend perpendicular to the first surface 110F1 of the substrate 110.

In some example embodiments, as shown for example in FIG. 2, the first cover insulating layer 152, which is disposed on the first transmission gate electrode TG1 in one active pixel PX, and the second cover insulating layer 154, which is disposed on the second storage gate electrode SG2 in a neighboring active pixel PX, may be connected to each other and integrally formed. However, some example embodiments of the inventive concepts are not limited thereto.

As the first cover insulating layer 152 vertically overlaps the first transmission gate electrode TG1 and the storage wire layer 136, the organic photoelectric conversion layer 160 may not directly contact the channel layer 140TX of the first transmission transistor TX1. That is, the first cover insulating layer 152 may be disposed between the organic photoelectric conversion layer 160 and the channel layer 140TX of the first transmission transistor TX1. Therefore, while the photo-charges are accumulated in the organic photoelectric conversion layer 160, the generation of a parasitic field in the channel layer 140TX, which occurs due to the first transmission gate electrode TG1, may be prevented, and accordingly, a current leakage due to the first transmission gate electrode TG1 may be prevented. Also, when the first transmission transistor TX1 is turned on, a noise current, which occurs due to the parasitic field of the first transmission gate electrode TG1, may greatly decrease.

As the second cover insulating layer 154 vertically overlaps the second storage gate electrode SG2, the organic photoelectric conversion layer 160 may not directly contact a portion of the semiconductor layer 140 on the second storage gate electrode SG2. That is, the second cover insulating layer 154 may be disposed between the organic photoelectric conversion layer 160 and the portion of the semiconductor layer 140. Therefore, while the photo-charges are accumulated in the organic photoelectric conversion layer 160, the generation of a parasitic field in the portion of the semiconductor layer 140, which occurs due to the second storage gate electrode SG2, may be prevented, and a current leakage due to the second storage gate electrode SG2 may be prevented accordingly.

The first cover insulating layer 152 and the second cover insulating layer 154 may not vertically overlap most regions of the first storage gate electrode SG1. As shown in FIG. 5, the semiconductor layer 140, which is above most regions of the first storage gate electrode SG1, may directly contact the organic photoelectric conversion layer 160. The first storage gate electrode SG1 may have a relatively great area, and for example, the area of the first storage gate electrode SG1 may be at least 50% of an area of the active pixel PX. Accordingly, in a relatively great region of the active pixel PX, the photo-charges may be transmitted from the organic photoelectric conversion layer 160 to the storage node SN1.

The organic photoelectric conversion layer 160 may be disposed on the cover insulating layer 150 and the semiconductor layer 140. The organic photoelectric conversion layer 160 may include an organic material for absorbing light in a range from about 400 nm to about 1500 nm. The organic photoelectric conversion layer 160 may include a p-type semiconductor and an n-type semiconductor, and for example, at least one of the p-type semiconductor and the n-type semiconductor may absorb light in the entire visible-light range. For example, the organic photoelectric conversion layer 160 may include a panchromatic photoelectric conversion material capable of causing a photoelectric change in all wavelengths of red light, blue light, and green light. In some example embodiments, the organic photoelectric conversion layer 160 may include a photoelectric conversion material capable of causing a photoelectric change in wavelengths of near infrared rays or infrared rays.

As shown in at least FIGS. 3 and 4, the organic photoelectric conversion layer 160 may be on an upper surface 140F1 of the semiconductor layer and an upper surface 152F1 of the first cover insulating layer 152 and an upper surface 154F1 of the second cover insulating layer 154. As shown in at least FIGS. 3 and 4, the organic photoelectric conversion layer 160 may be directly on both at least a portion of the upper surface 140F1 of the semiconductor layer and at least a portion of the upper surface 152F1 of the first cover insulating layer 152 and at least a portion of the upper surface 154F1 of the second cover insulating layer 154 (e.g., may directly contact upper surfaces 152F1 and 154F1 and side surfaces 152F2 and 154F2 of the first and second cover insulating layers 152 and 154 and may extend through an opening G1 in the cover insulating layer 150 that is at least partially defined by the side surfaces 152F2 and 154F2 of the first and second cover insulating layers to directly contact a portion of the upper surface 140F1 that is exposed from the first and second cover insulating layers 152 and 154 by the opening G1.

In some example embodiments, the cover insulating layer 150 may omit the second cover insulating layer 154 (e.g., in some example embodiments where the second storage gate electrode SG2 is omitted).

The organic photoelectric conversion layer 160 may be a layer or layers in which p-type semiconductor materials and n-type semiconductor materials form a pn flat junction or a bulk heterojunction, and may be a layer used to separate excitons into holes and electrons after the excitons are generated by receiving incident light. The organic photoelectric conversion layer 160 may be a layer or layers. The organic photoelectric conversion layer 160 may include, for example, various combinations such as an intrinsic layer (an I layer), a p-type layer/an I layer, an I layer/an n-type layer, a p-type layer/an I layer/an n-type layer, and a p-type layer/an-type layer.

The organic photoelectric conversion layer 160 may have, for example, a thickness of between about 1 nm and about 500 nm. In some example embodiments, the organic photoelectric conversion layer 160 may have, for example, a thickness of between about 5 nm and about 300 nm. The organic photoelectric conversion layer 160 may have a thickness that enables an effective improvement in photoelectric conversion efficiency by effectively absorbing light and effectively separating and transmitting the holes and electrons.

In some example embodiments, the organic photoelectric conversion layer 160 may include at least two materials from polyaniline, polypyrole, polythiophenes, poly(p-phenylenevinylene), benzodithiophene, thienothiophene, poly[2-methoxy-5-(2'-ethyl-hexyloxy)-1,4-phenylene vinylene (MEH-PPV), poly(2-methoxy-5-(3,7-dimethyloctyloxy)-1,4-phenylene-vinylene (MDMO-PPV), pentacene, perylene, poly(3,4-ethylenedioxythiophene) (PEDOT), poly(3-alkyl-thiophene), poly((4,8-bis(octyloxy)benzo(1,2-b:4,5-b')dithi-ophene)-2,6-diyl-alt-(2-(dodecyloxy)carbonyl)thieno(3,4-b)thiophenediyl)-3,6-diyl) (PTB1), poly((4,8-bis(2-ethylhexyloxy)benzo[1,2-b:4,5-b']dithiophene)-2,6-diyl-alt-(2-((2-ethylhexyloxy)carbonyl)-3-fluorothieno[3,4-b]thiophenediyl)-3,6-diyl)) (PTB7), phthalocyanine, tin (II) phthalocyanine, (SnPc), copper phthalocyanine, triarylamine, benzidine, pyrazoline, styrylamine, hydrazone, carbazole, thiophene, 3,4-ethylenedioxythiophene (EDOT), pyrrole, phenanthrene, tetracene, naphthalene, rubrene, 1,4,5,8-naphthalene-tetracarboxylic dianhydride (NTCDA), Alq3, fullerene (e.g., C60, C70, C74, C76, C78, C82, C84, C720, C860, etc.), fullerene derivatives such as 1-(3-methoxy-carbonyl)propyl-1-phenyl(6,6)C61 (PCBM), C71-PCBM, C84-PCBM, or bis-PCBM, an inorganic conductor such as CdS, CdTe, CdSe, or ZnO, derivatives thereof, and/or copolymers thereof. However, some example embodiments are not limited thereto.

The upper electrode 162 may be disposed on the organic photoelectric conversion layer 160. The upper electrode 162 may cover the entire upper surface of the organic photoelectric conversion layer 160. The upper electrode 162 may vertically overlap all active pixels PX.

The upper electrode 162 may be a light-transmissive electrode, and light penetrating the upper electrode 162 may be absorbed into the organic photoelectric conversion layer 160. In some example embodiments, the upper electrode 162 may include at least one of ITO, IZO, ZnO, SnO, ATO, AlTO, and FTO.

A first passivation layer 170 may be disposed on the upper electrode 162. A color filter CF may be disposed on the first passivation layer 170. The color filter CF disposed on the first active pixel PX1 may include a material for penetrating light in a first wavelength range, for example, may be a red color filter. The color filter CF disposed on the second active pixel PX2 may include a material for penetrating light in a second wavelength range, for example, a green color filter. The color filter CF disposed on the third active pixel PX3 may include a material for penetrating light in a third wavelength range, for example, a blue color filter. As shown in FIG. 2, the first active pixel PX1, the second active pixel PX2, and the third active pixel PX3 may be arranged in a Bayer pattern, but some example embodiments are not limited thereto.

The micro-lens ML may be disposed on the color filter CF.

Hereinafter, a readout method of the image sensor 100 will be described with reference to FIG. 6.

Referring to FIG. 6, the active pixels PX may be arranged in a matrix form. Each active pixel PX may include four logic transistors RX, SX, SFX, and TX1. Here, the logic transistors may include the reset transistor RX, a selection transistor SX, the source follower transistor SFX, and the first transmission transistor TX1.

Each active pixel PX may further include an organic photoelectric conversion device OPD1 and the floating diffusion region FD. The organic photoelectric conversion device OPD1 may be realized by the organic photoelectric conversion layer 160 described with reference to FIGS. 1 to 4 and the upper electrode 162 and the first storage gate electrode SG1, which are disposed on upper and lower portions of the organic photoelectric conversion layer 160. The storage node SN1 may be connected to one end of the organic photoelectric conversion device OPD1, and the first voltage VPD1 may be applied to one end of the storage node SN1 (e.g., the first storage gate electrode SG1), and an upper electrode voltage $V_T$ may be applied to the upper electrode 162. The organic photoelectric conversion device OPD1 may generate and accumulate the photo-charges in proportion to the amount of light incident from the outside.

The storage node SN1 may be realized by the semiconductor layer 140 and the dielectric layer 142, the first voltage VPD1 may be applied to one end of the storage node SN1, and the first transmission transistor TX1 and the organic photoelectric conversion device OPD1 may be connected to the other end of the storage node SN1. In some example embodiments, the first voltage VPD1 may be a signal input from the outside of the active pixel PX and may be a DC voltage.

As shown in at least FIG. 4, one end TX1-1 of the first transmission transistor TX1 may be connected (e.g., electrically connected, directly or via one or more interposing structures) to the other end of the storage node SN1 and the organic photoelectric conversion device OPD1, and the other end TX1-2 (e.g., another end) of the first transmission transistor TX1 may be connected (e.g., electrically connected, directly or via one or more interposing structures, e.g., via the storage contact 138, the storage wire layer 136, the contacts 134, and/or wire layers 132, etc.) to the floating diffusion region FD. The first transmission gate electrode TG1 of the first transmission transistor TX1 may be gated in response to a first transmission control signal TGS1.

When the first transmission transistor TX1 is off and the first voltage VPD1 is applied to the storage node SN1, the storage node SN1 may store therein optical signals that are charges generated from the organic photoelectric conversion device OPD1. When the first transmission transistor TX1 is off and the first voltage VPD1 is applied to the storage node SN1, the reset transistor RX may reset the floating diffusion region FD to a power voltage VDD.

When the optical signals generated by the organic photoelectric conversion device OPD1 are stored in the storage node SN1, and when the first transmission transistor TX1 connecting the storage node SN1 to the floating diffusion region FD is off, the image sensor 100 may have improved operation reliability by resetting the floating diffusion region FD to the power voltage VDD.

When the first transmission transistor TX1 is on in response to the first transmission control signal TGS1, the first transmission transistor TX1 may transmit, to the floating diffusion region FD, the optical signals stored in the storage node SN1. Because the optical signals are stored in the storage node SN1, the first transmission transistor TX1 may be on only when the optical signals are transmitted from the storage node SN1 to the floating diffusion region FD, and the amount of power consumed by the image sensor 100 may decrease.

A gate terminal of the source follower transistor SFX may be connected to the floating diffusion region FD. The source follower transistor SFX may operate as a source follower buffer amplifier because of the charges accumulated in the floating diffusion region FD, amplify a potential change in the floating diffusion region FD, and output an output voltage VOUT to a column line.

The selection transistor SX may select the active pixels PX in row units, and when the selection transistor SX is turned on, the power voltage VDD may be transmitted to a source electrode of the source follower transistor SFX. A row driver may operate in response to a selection control signal SEL and perform switching and addressing operations. When the selection control signal SEL is transmitted from the row driver, the output voltage VOUT may be output to the column line connected to the selection transistor SX.

The reset transistor RX may periodically reset the charges accumulated in the floating diffusion region FD. A drain electrode of the reset transistor RX may be connected to the floating diffusion region FD, and a voltage of the floating diffusion region FD may be reset to be a readout voltage VRD in response to a reset control signal RG input by the row driver.

In general, an image sensor including an organic photoelectric conversion layer may be of a 3T type that includes the selection transistor SX, the source follower transistor SFX, and the reset transistor RX or of a 4T type that further includes a transmission transistor TX on a silicon substrate. However, the photo-charges generated by the organic photoelectric conversion layer may leak into the floating diffusion region FD, or noise may occur.

However, according to the example embodiments described with reference to FIGS. 1 to 6, the semiconductor layer 140 and the dielectric layer 142, which are adjacent to the organic photoelectric conversion layer 160, may form the storage node SN1, and the first transmission gate electrode TG1 adjacent to the first storage gate electrode SG1, a portion of the semiconductor layer 140 (in other words, the channel layer 140TX, also referred to herein as a first portion of the semiconductor layer 140) vertically overlapping the first transmission gate electrode TG1, and a portion of the dielectric layer 142 (in other words, the gate dielectric layer 142TX, which is between, and overlaps, the channel layer 140TX and the first transmission gate electrode TG1 in the vertical direction) may form (e.g., interchangeably used herein with the term "at least partially define") the first transmission transistor TX1. Also, the first cover insulating layer 152 is disposed on the channel layer 140TX. Because the channel layer 140TX and the organic photoelectric conversion layer 160 may not directly contact each other because of the first cover insulating layer 152, a current leakage or the generation of a noise current, which may result from a parasitic field generated in the channel layer 140TX by the first transmission gate electrode TG1, may decrease or may be prevented.

Also, as the second voltage VPD2, which is different from the first voltage VPD1 applied to the first storage gate electrode SG1, is applied to the second storage gate electrode SG2 that is adjacent to the first storage gate electrode SG1, a full well capacity may be secured while the photo-charges generated by the organic photoelectric conversion layer 160 are accumulated in the storage node SN1, and the transmission of the photo-charges may be accelerated by a potential gradient with the first storage gate electrode SG1 when the signal is transmitted from the storage node SN1 through the first transmission transistor TX1. Accordingly, the second storage gate electrode SG2 may form a potential gradient with the first storage gate electrode SG1 in response to the first transmission transistor TX1 being turned on and photo-charges stored in the storage node SN1 being transmitted to the floating diffusion region FD (e.g., via the first transmission transistor).

Figure 7:
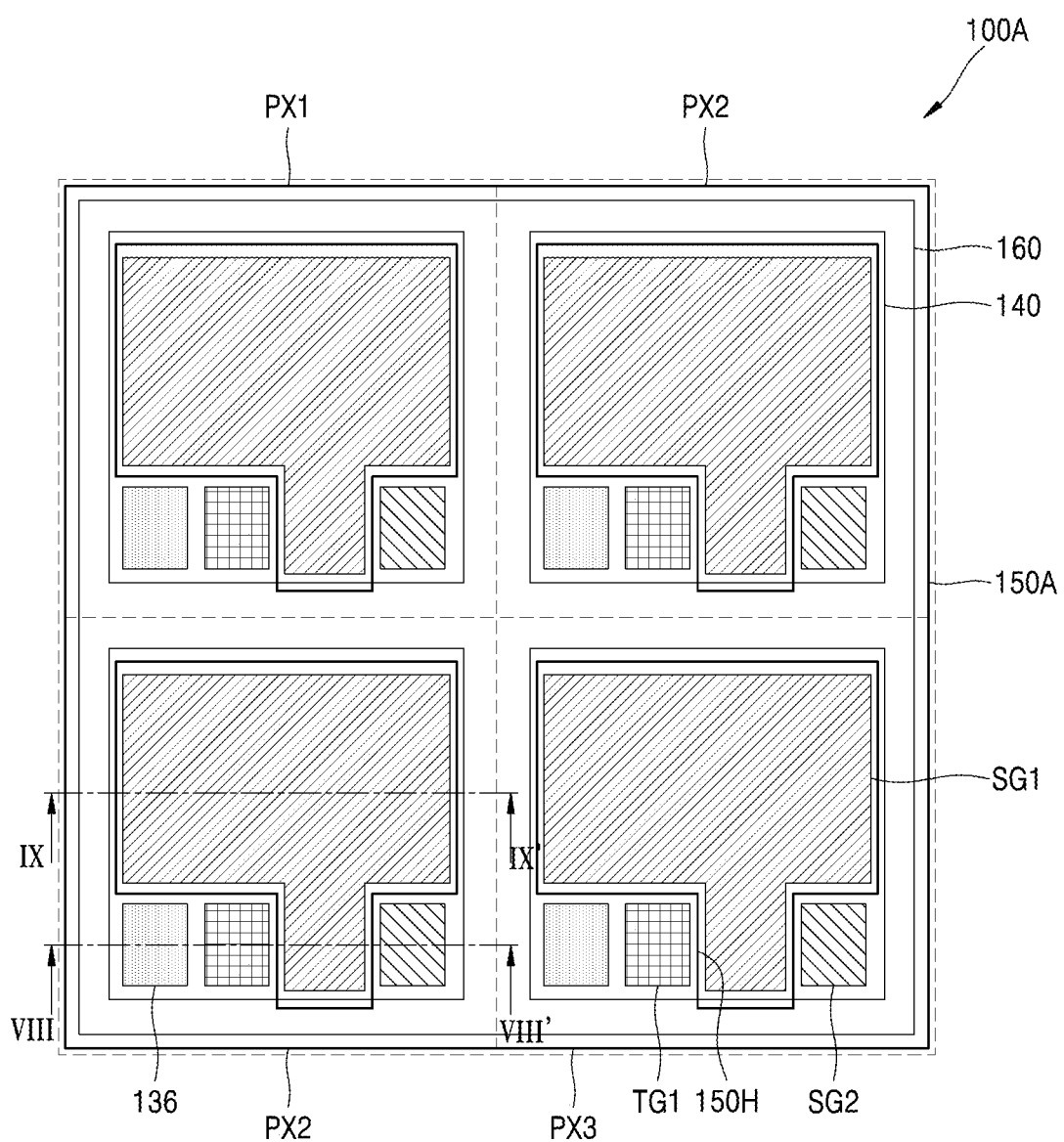
FIG. 7 is a layout of an image sensor according to some example embodiments.
Figure 8:
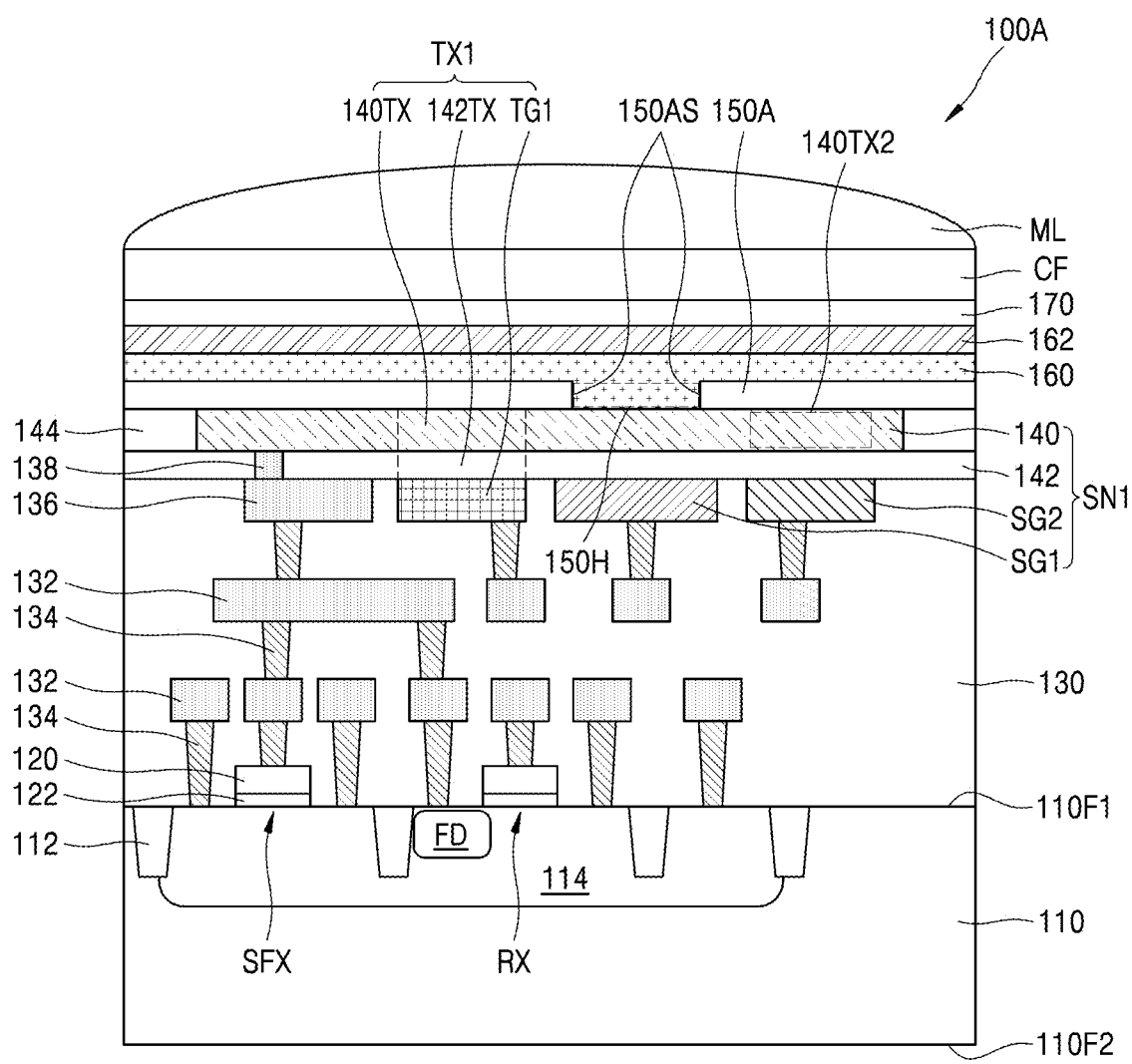
FIG. 8 is a cross-sectional view taken along a line VIII-VIII' of FIG. 7.
Figure 9:
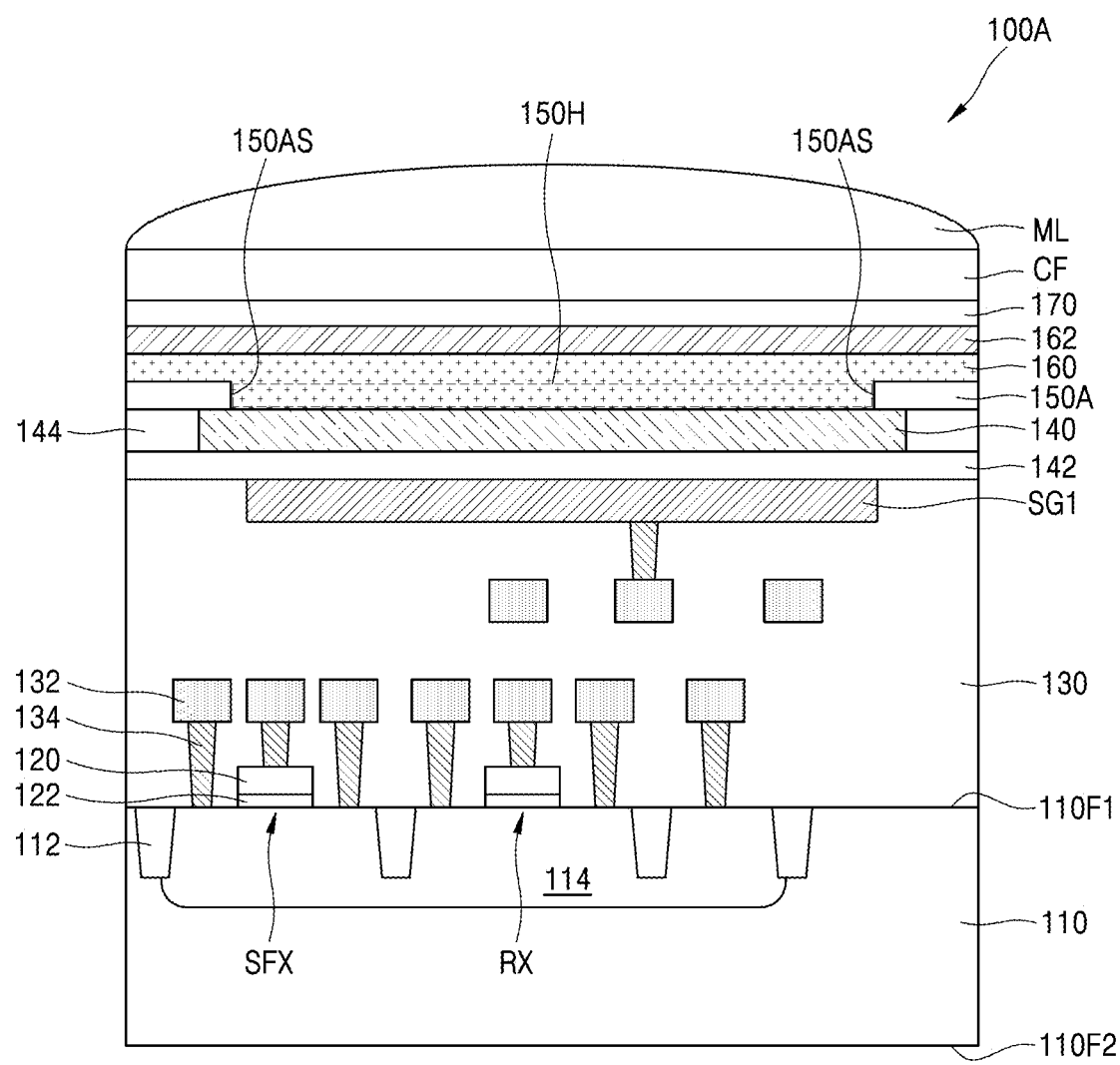
FIG. 9 is a cross-sectional view taken along a line IX-IX' of FIG. 7.

FIG. 7 is a layout of an image sensor 100A according to some example embodiments. FIG. 8 is a cross-sectional view taken along a line VIII-VIII' of FIG. 7. FIG. 9 is a cross-sectional view taken along a line IX-IX' of FIG. 7. In FIGS. 7 to 9, the same reference symbols as those in FIGS. 1 to 6 denote like elements.

Referring to FIGS. 7 to 9, a cover insulating layer 150A may include one or more surfaces 150AS that at least partially define an opening 150H in and through the cover insulating layer 150A, and the opening 150H may not vertically overlap the first transmission gate electrode TG1, the storage wire layer 136, and the second storage gate electrode SG2. Accordingly, portions of the semiconductor layer 140, which are disposed on the first transmission gate electrode TG1, the storage wire layer 136, and the second storage gate electrode SG2, are covered by a cover insulating layer 150A (e.g., are overlapped with the cover insulating layer 150A in the vertical direction), and the cover insulating layer 150A may be disposed between the portions of the semiconductor layer 140 and the organic photoelectric conversion layer 160. The semiconductor layer 140 and the cover insulating layer 150A may be understood to be between the first transmission gate electrode TG1 and the organic photoelectric conversion layer 160 (e.g., in the vertical direction). The semiconductor layer 140 and the cover insulating layer 150A may be understood to be between the second storage gate electrode SG2 and the organic photoelectric conversion layer 160 (e.g., in the vertical direction). Where an element (e.g., the second storage gate electrode SG2) is described to be covered by the cover insulating layer 150A, said element will be understood to be overlapped with the cover insulating layer 150A in the vertical direction.

As shown in at least FIG. 8, the cover insulating layer 150A may contact (e.g., directly contact) a first portion of the semiconductor layer 140 that is on (e.g., vertically overlaps) the first transmission gate electrode TG1 (where said first portion may define the channel layer 140TX) and may further contact (e.g., directly contact) a second portion 140TX2 of the semiconductor layer 140 that is on (e.g., vertically overlaps) the second storage gate electrode SG2.

The opening 150H may vertically overlap the entire area of the first storage gate electrode SG1 such that the first storage gate electrode SG1 may be exposed from the cover insulating layer 150A by the opening 150H in the vertical direction, and the organic photoelectric conversion layer 160 on the semiconductor layer 140 and the cover insulating layer 150A and filling the inside of the opening 150H (e.g., filling an entirety of the opening 150H) may directly contact a portion of the semiconductor layer 140 that is disposed on the first storage gate electrode SG1. The first storage gate electrode SG1 may have a relatively great area, and for example, the area of the first storage gate electrode SG1 may be at least about 50% of the area of the active pixel PX. Accordingly, in the relatively great area of the active pixel PX, the photo-charges may be transmitted from the organic photoelectric conversion layer 160 to the storage node SN1.

According to some example embodiments, a current leakage or the generation of a noise current, which may result from a parasitic field generated in the channel layer 140TX by the first transmission gate electrode TG1, may decrease or may be prevented.

Figure 10:
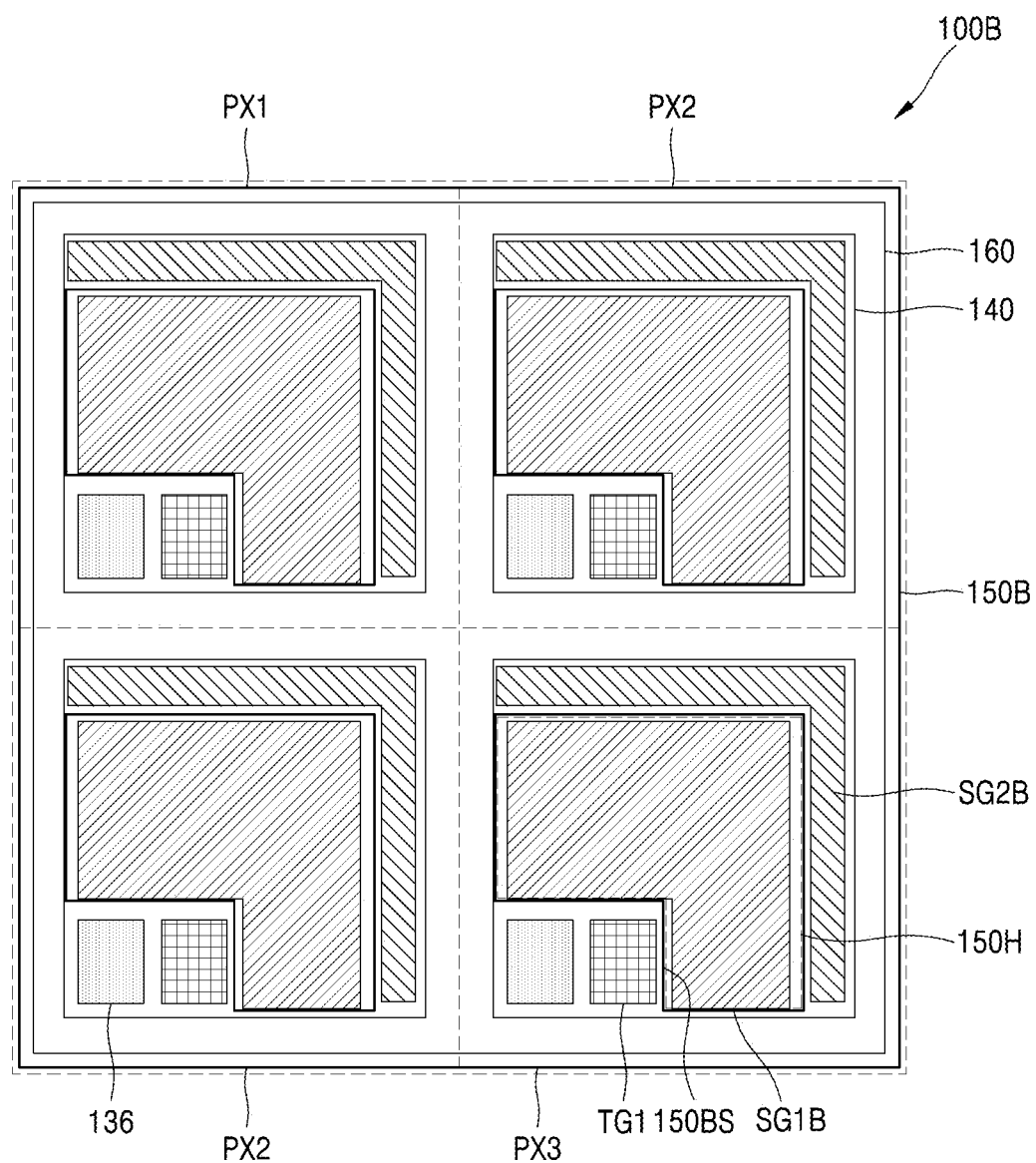
FIG. 10 is a layout of an image sensor according to some example embodiments.

FIG. 10 is a layout of an image sensor 100B according to some example embodiments. In FIG. 10, the same reference symbols as those in FIGS. 1 to 9 denote like elements.

Referring to FIG. 10, in a plan view, a second storage gate electrode SG2B may surround at least two side surfaces of a first storage gate electrode SG1B. For example, as shown in FIG. 10, in the plan view, the second storage gate electrode SG2B may surround two side surfaces of the first storage gate electrode SG1B. In some example embodiments, in the plan view, the second storage gate electrode SG2B may surround three side surfaces of the first storage gate electrode SG1B.

A cover insulating layer 150B includes (e.g., includes one or more surfaces 150BS that at least partially define) the opening 150H vertically overlapping the first storage gate electrode SG1B, and the cover insulating layer 150B may vertically overlap all of the first transmission gate electrode TG1, the second storage gate electrode SG2B, and the storage wire layer 136. Accordingly, the organic photoelectric conversion layer 160 may be in the opening 150H, and in the opening 150H, a bottom surface of the organic photoelectric conversion layer 160 may contact an upper surface of the semiconductor layer 140 that is on the entire upper portion of the first transmission gate electrode TG1.

According to some example embodiments, in the plan view, the second storage gate electrode SG2 may surround at least two side surfaces of the first storage gate electrode SG1, and the second voltage VPD2, which is different from the voltage applied to the first storage gate electrode SG1, may be applied to the second storage gate electrode SG2. Accordingly, a full well capacity may be secured when the photo-charges generated by the organic photoelectric conversion layer 160 are accumulated in the storage node SN1. Also, the transmission of the photo-charges may be accelerated by the potential gradient with the first storage gate electrode SG1 when the signal is transmitted from the storage node SN1 through the first transmission transistor TX1. Accordingly, the second storage gate electrode SG2 may form a potential gradient with the first storage gate electrode SG1 in response to the first transmission transistor TX1 being turned on and photo-charges stored in the storage node SN1 being transmitted to the floating diffusion region FD (e.g., via the first transmission transistor).

Figure 11:
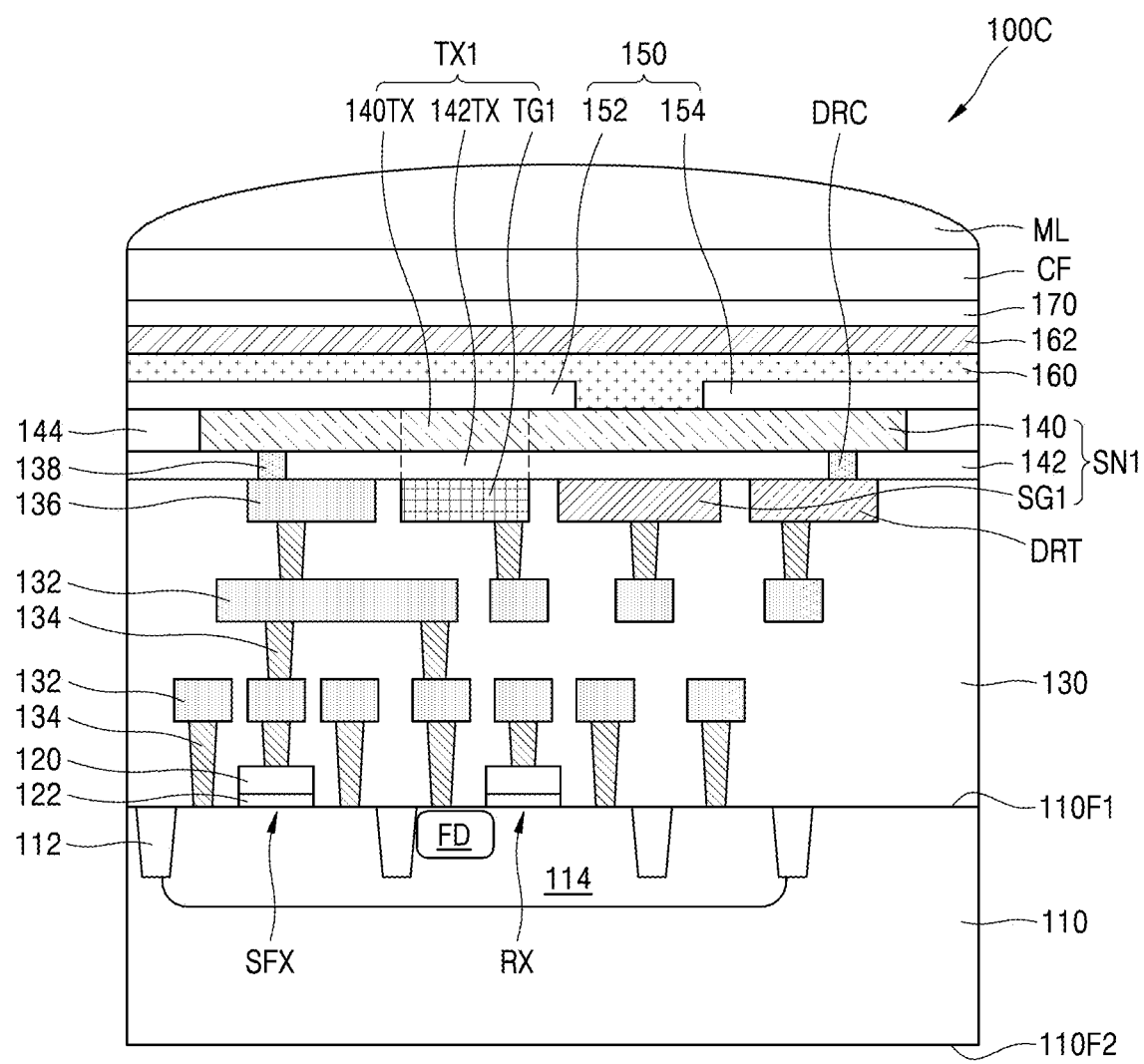
FIG. 11 is a cross-sectional view of an image sensor according to some example embodiments.

FIG. 11 is a cross-sectional view of an image sensor 100C according to some example embodiments. In FIG. 11, the same reference symbols as those in FIGS. 1 to 10 denote like elements.

Referring to FIG. 11, the image sensor 100C may include a drain terminal DRT that is isolated from direct contact with the first storage gate electrode SG1. The image sensor 100C may further include a drain contact DRC that connects (e.g., electrically connects) the drain terminal DRT to the semiconductor layer 140 (e.g., through the dielectric layer 142). The drain terminal DRT may be disposed on one side of the first storage gate electrode SG1. The drain terminal DRT may be at the same vertical level (e.g., distance in the vertical direction from the first surface 110F1) as the first storage gate electrode SG1 and the first transmission gate electrode TG1. The drain terminal DRT may be electrically connected to the semiconductor layer 140 of the storage node SN1 by a drain contact DRC. The drain contact DRC may penetrate the dielectric layer 142 and connect the drain terminal DRT to the semiconductor layer 140. The first cover insulating layer 152 may vertically overlap the first storage gate electrode SG1, and the second cover insulating layer 154 may vertically overlap the drain terminal DRT.

The semiconductor layer 140, the dielectric layer 142, the first storage gate electrode SG1, the first transmission gate electrode TG1, and the drain terminal DRT may form one phototransistor. For example, when the first voltage VPD1 is applied to the first storage gate electrode SG1 and when the upper electrode voltage $V_T$ (see FIG. 6) is applied to the upper electrode 162, the photo-charges are generated by the organic photoelectric conversion layer 160 and stored in the interface between the semiconductor layer 140 and the dielectric layer 142. The semiconductor layer 140 on the upper portion of the first storage gate electrode SG1 (hereinafter, referred to as a channel region) may function as a channel of the phototransistor according to the amount of photo-charges stored between the semiconductor layer 140 and the dielectric layer 142.

As a drain voltage is applied to the drain terminal DRT, a current may be injected into the semiconductor layer (that is, the channel region) on the upper portion of the first storage gate electrode SG1. The first transmission gate electrode TG1 may function as a switch that allows electrons injected from the drain terminal DRT to flow in the floating diffusion region FD and the source follower transistor SFX through the channel region. Accordingly, it will be understood that the drain terminal DRT may be configured to provide a current (e.g., injected) to the semiconductor layer 140 to make the semiconductor layer 140 function as a channel region of a phototransistor. As the semiconductor layer 140, the dielectric layer 142, the first storage gate electrode SG1, the first transmission gate electrode TG1, and the drain terminal DRT function as the phototransistor, the phototransistor may amplify a current flowing through the first transmission transistor TX1 despite the relatively small amount of photo-charges stored in the organic photoelectric conversion layer 160, and thus, the image sensor 100C may have great sensitivity.

Also, a current leakage or the generation of a noise current, which may result from a parasitic field generated in the channel layer 140TX by the first transmission gate electrode TG1, may decrease or may be prevented.

Figure 12:
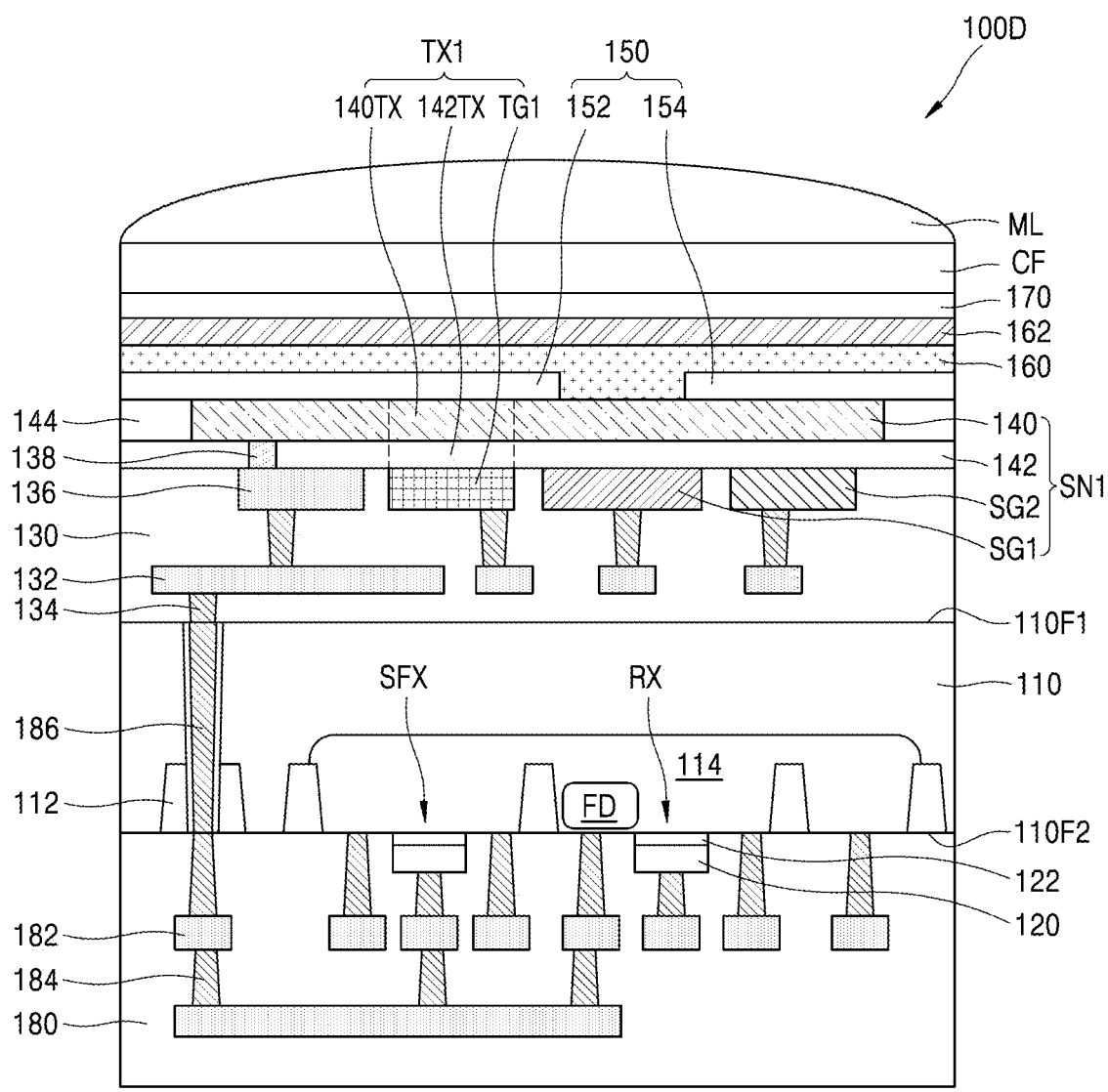
FIG. 12 is a cross-sectional view of an image sensor according to some example embodiments.

FIG. 12 is a cross-sectional view of an image sensor 100D according to some example embodiments. In FIG. 12, the same reference symbols as those in FIGS. 1 to 11 denote like elements.

Referring to FIG. 12, the device isolation layers 112 may be disposed in the substrate 110 adjacent to the second surface 110F2 of the substrate 110, and a stack structure including the gate insulating layer 122 and the gate electrode 120 may be disposed on the second surface 110F2 of the substrate 110. Impurity regions (not shown) may be further formed in the substrate 110 on both sides of the gate electrode 120.

On the second surface 110F2 of the substrate 110, wire layers 182 and the contacts 184, which are electrically connected to the gate electrode 120 and the impurity regions, may be disposed. On the second surface 110F2 of the substrate 110, an interlayer insulating layer 180 may cover the gate electrode 120, the wire layers 182, and the contacts 184.

Through vias 186 may penetrate the substrate 110 and extend in a vertical direction. The through vias 186 may electrically connect the wire layers 132 and the contacts 134, which are disposed on the first surface 110F1 of the substrate 110, to the wire layers 182 and the contacts 184 disposed on the second surface 110F2 of the substrate 110.

Figure 13:
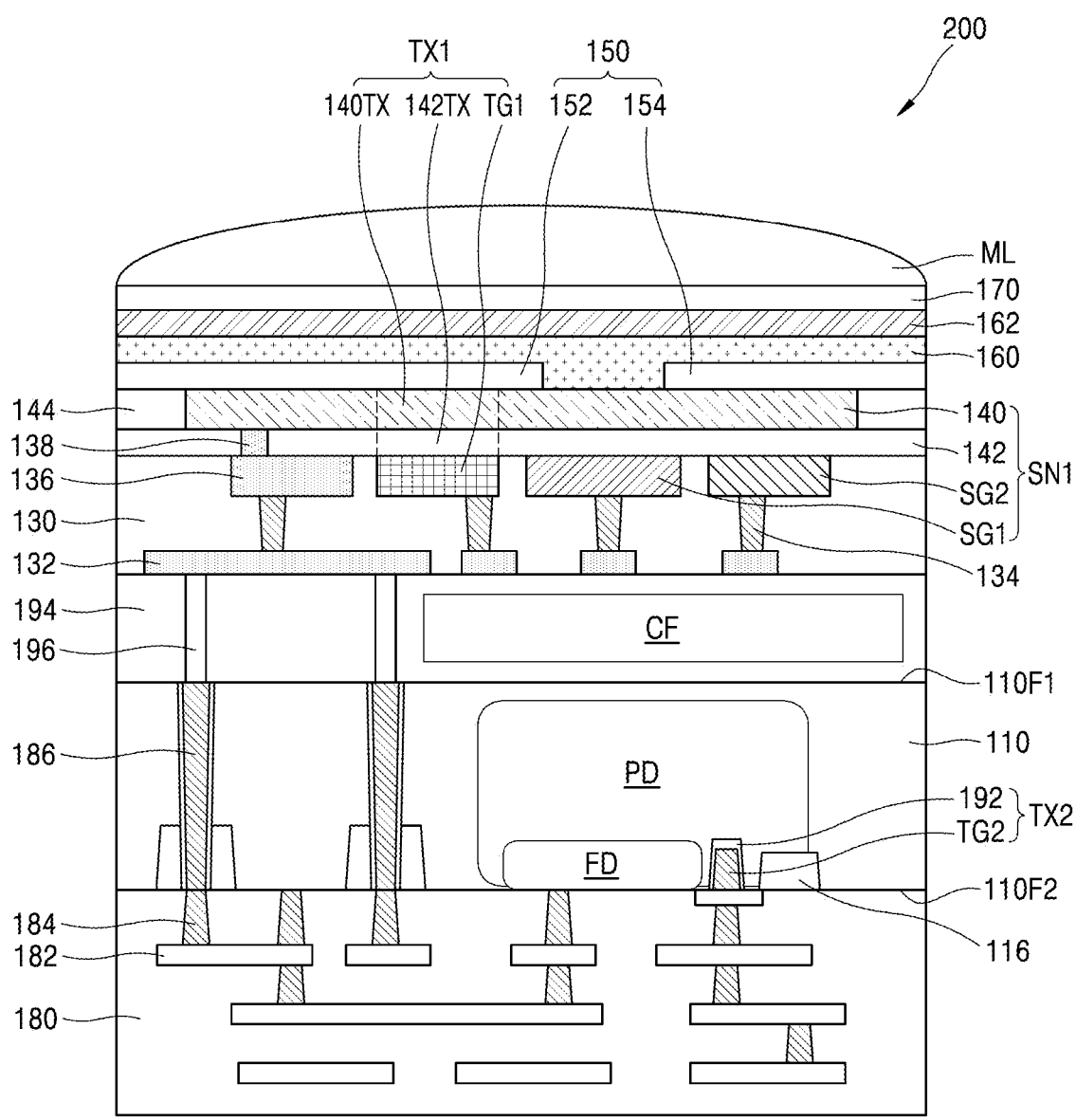
FIG. 13 is a cross-sectional view of an image sensor according to some example embodiments.
Figure 14:
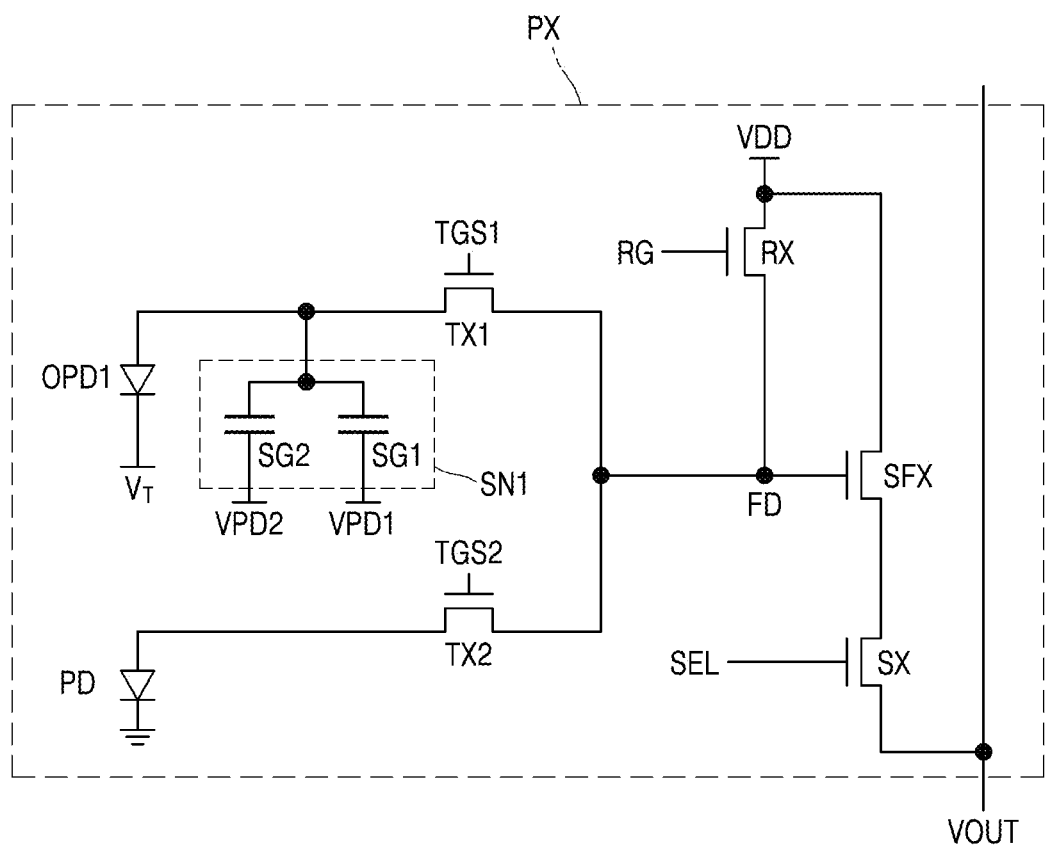
FIG. 14 is a readout circuit of the image sensor of FIG. 13.

FIG. 13 is a cross-sectional view of an image sensor 200 according to some example embodiments. FIG. 14 is a readout circuit of the image sensor 200 of FIG. 13.

Referring to FIGS. 13 and 14, a photoelectric conversion region PD may be in (e.g., at least partially within) the substrate 110 (e.g., partially or completely between first and second surfaces 110F1 and 110F2). The photoelectric conversion region PD may include one or more photodiodes, phototransistors, photogates, pinned photodiodes (PPD), or any combinations thereof. The photoelectric conversion region PD and the organic photoelectric conversion layer 160 may detect light of different wavelengths. Each of the photoelectric conversion region PD and the organic photoelectric conversion layer 160 may receive light through the micro-lens ML, and first and second optical signals, which are photo-charges, may be respectively generated in proportion to the amount of incident light. The photoelectric conversion region PD may be formed by doping the substrate 110 with impurities having a conductivity type different from that of the substrate 110. The photoelectric conversion region PD may have a difference between impurity concentrations in upper and lower portions of the photoelectric conversion region PD to have a potential gradient in a direction perpendicular to the first surface 110F1 of the substrate 110. For example, the photoelectric conversion region PD may be formed as multiple impurity regions are stacked.

As shown in at least FIG. 13, on the second surface 110F2 of the substrate 110, a second transmission gate electrode TG2 may be disposed, such that the image sensor 200 includes a second transmission gate electrode TG2 on (e.g., (in)directly above or (in)directly below) the second surface 110F2 of the substrate 110. The second transmission gate electrode TG2 may be located closer to the first surface 110F1 in the vertical direction than a furthest distance of the second surface 110F2 from the first surface 110F1 in the vertical direction. The second transmission gate electrode TG2 may be in a recess (not shown) formed in the second surface 110F2 of the substrate 110, and the gate insulating layer 192 may be disposed between the second transmission gate electrode TG2 and the second surface 110F2 of the substrate 110, such that the second transmission gate electrode TG2 may be indirectly below the second surface 110F2 within the recess, isolated from direct contact therewith by at least the gate insulating layer 192. The gate insulating layer 192 may include a high-k material such as silicon oxide, hafnium oxide, hafnium silicon oxide, lanthanum oxide, or lanthanum aluminum oxide.

The second transmission gate electrode TG2 and the gate insulating layer 192 may form a second transmission transistor TX2 (see FIG. 14). As shown in FIG. 13, the image sensor 200 may include a floating diffusion region FD that may be on one side of (e.g., adjacent to in a horizontal direction extending parallel to the first surface 110F1) the second transmission gate electrode TG2 in the substrate 110, and a source region 116 may be on the other side of the second transmission gate electrode TG2. As shown in FIG. 13, one or more through vias 186 may penetrate the substrate 110 and extend in a vertical direction and the semiconductor layer 140 may be electrically connected to the floating diffusion region FD through one or more of the through vias 186.

An insulating layer 194 may be disposed on the first surface 110F1 of the substrate 110, and the interlayer insulating layer 130 may be disposed on the insulating layer 194. The color filter CF may be at a lower vertical level than the interlayer insulating layer 130 on the first surface 110F1 of the substrate 110, and the insulating layer 194 may cover an upper surface of the color filter CF. A contact 196 may penetrate the insulating layer 194 and extend in a vertical direction, and the contact 196 may connect the wire layers 132 to the through vias 186.

As shown in FIG. 14, each active pixel PX may include the reset transistor RX, the selection transistor SX, the source follower transistor SFX, the first transmission transistor TX1, and the second transmission transistor TX2.

One end of the first transmission transistor TX1 may be connected to the organic photoelectric conversion layer 160 and the storage node SN1, and the other end of the first transmission transistor TX1 may be connected to the floating diffusion region FD. The first transmission gate electrode TG1 of the first transmission transistor TX1 may be gated in response to the first transmission control signal TGS1.

One end of the second transmission transistor TX2 may be connected to the photoelectric conversion region PD, and the other end of the second transmission transistor TX2 may be connected to the floating diffusion region FD. The second transmission gate electrode TG2 of the second transmission transistor TX2 may be gated in response to a second transmission control signal TGS2. The second transmission transistor TX2 may transmit the second optical signal, which is the charge generated by the photoelectric conversion region PD, to the floating diffusion region FD in response to the second transmission control signal TGS2. The first transmission transistor TX1 and the second transmission transistor TX2 may share the floating diffusion region FD. The floating diffusion region FD may receive the first optical signal and/or the second optical signal and may cumulatively store the same.

One end of the reset transistor RX may be connected to the power voltage VDD, and the other end of the reset transistor RX may be connected to the floating diffusion region FD. A reset gate electrode of the reset transistor RX may be gated in response to a reset control signal RG. The reset transistor RX may reset the floating diffusion region FD to the power voltage VDD.

One end of the source follower transistor SFX may be connected to the power voltage VDD, and the other end of the source follower transistor SFX may be connected to one end of the selection transistor SX. The source follower transistor SFX may be a driving transistor that may be controlled by the floating diffusion region FD and may generate an output voltage.

Figure 15:
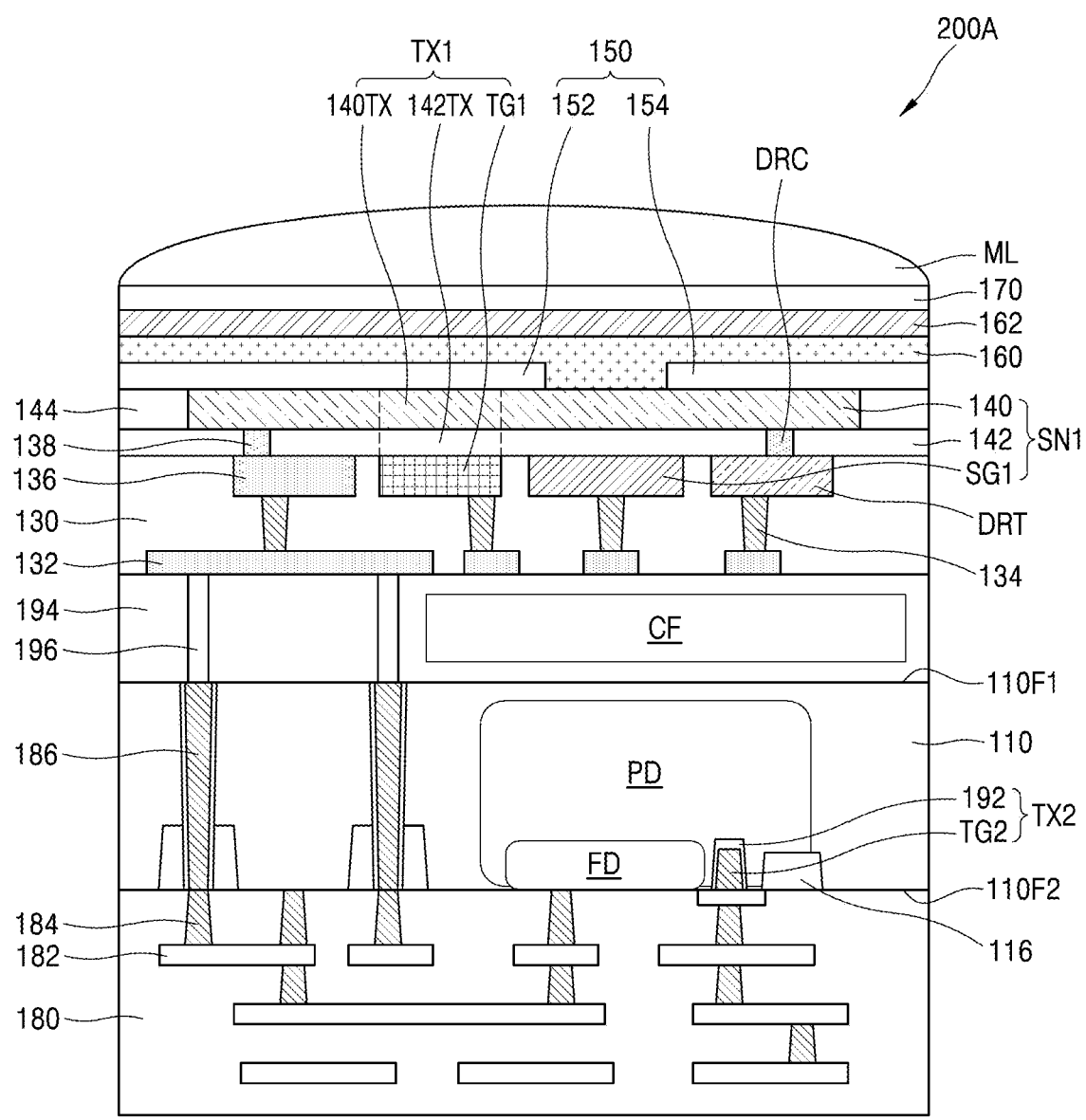
FIG. 15 is a cross-sectional view of an image sensor according to some example embodiments.

FIG. 15 is a cross-sectional view of an image sensor 200A according to some example embodiments. In FIG. 15, the same reference symbols as those in FIGS. 1 to 14 denote like elements.

Referring to FIG. 15, the drain terminal DRT may be disposed on one side of the first storage gate electrode SG1. The drain terminal DRT may be electrically connected to the semiconductor layer 140 of the storage node SN1 through the drain contact DRC. The first cover insulating layer 152 may vertically overlap the first storage gate electrode SG1, and the second cover insulating layer 154 may vertically overlap the drain terminal DRT.

The semiconductor layer 140, the dielectric layer 142, the first storage gate electrode SG1, the first transmission gate electrode TG1, and the drain terminal DRT may form one phototransistor. The semiconductor layer 140 on the upper portion of the first storage gate electrode SG1 (hereinafter, referred to as the channel region) may function as a channel of the phototransistor according to the amount of photo-charges stored between the semiconductor layer 140 and the dielectric layer 142.

As the drain voltage may be applied to the drain terminal DRT, a current may be injected into the semiconductor layer on the upper portion of the first storage gate electrode SG1 (hereinafter, referred to as the channel region). The first transmission gate electrode TG1 may function as a switch that allows electrons, which are injected from the drain terminal DRT, to flow in the floating diffusion region FD and the source follower transistor SFX, which are adjacent to the second surface 110F2 of the substrate 110, through the channel region via the storage contact 138, the storage wire layer 136, the contacts 134 and 196, and the through via 186.

The organic photoelectric conversion layer 160 may generate the first optical signal by detecting the light in the first wavelength range, and the photoelectric conversion region PD may generate the second optical signal by detecting the light in the second wavelength range. For example, even when a difference between a signal level of the first optical signal and a signal level of the second optical signal is relatively great (e.g., when the amount of photo-charges stored in the organic photoelectric conversion layer 160 is relatively small), the phototransistor may amplify the current flowing through the first transmission transistor TX1. Therefore, the image sensor 200A may have great sensitivity and great color reproducibility.

Also, a current leakage or the generation of a noise current, which may result from the parasitic field generated in the channel layer 140TX by the first transmission gate electrode TG1, may decrease or may be prevented.

Figure 16:
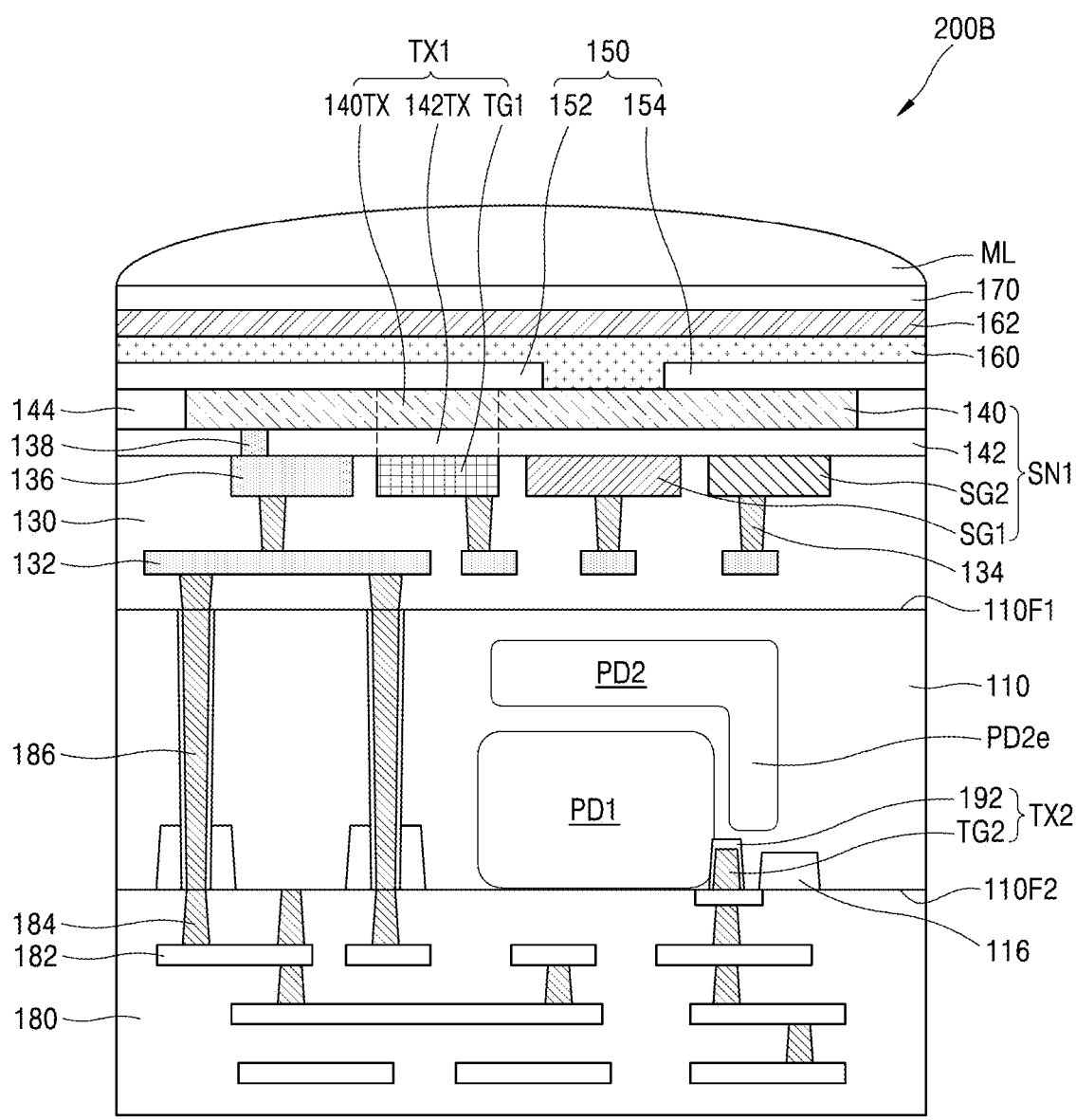
FIG. 16 is a cross-sectional view of an image sensor according to some example embodiments.

FIG. 16 is a cross-sectional view of an image sensor 200B according to some example embodiments. In FIG. 16, the same reference symbols as those in FIGS. 1 to 15 denote like elements.

Referring to FIG. 16, the image sensor 200B may not include the color filter CF, and a first photoelectric conversion region PD1 and a second photoelectric conversion region PD2 may be located in the substrate 110. The first photoelectric conversion region PD1 and the second photoelectric conversion region PD2 may be formed in different depths from the second surface 110F2 of the substrate 110. For example, the second photoelectric conversion region PD2 may be farther from the first photoelectric conversion region PD1 with respect to the second surface 110F2 of the substrate 110, and a vertical extension portion PD2e of the second photoelectric conversion region PD2 may extend towards the second surface 110F2 of the substrate 110.

The organic photoelectric conversion layer 160 may generate the first optical signal by detecting the light in the first wavelength range, for example, green light G, the second optical signal may be generated by detecting the light in the second wavelength range, for example, red light R, in the first photoelectric conversion region PD1, and a third optical signal may be generated by detecting the light in the third wavelength range, for example, blue light B, in the second photoelectric conversion region PD2. Therefore, in one active pixel PX, light corresponding to green light G, red light R, and blue light B may all be detected by the organic photoelectric conversion layer 160, the first photoelectric conversion region PD1, and the second photoelectric conversion region PD2.

Figure 17:
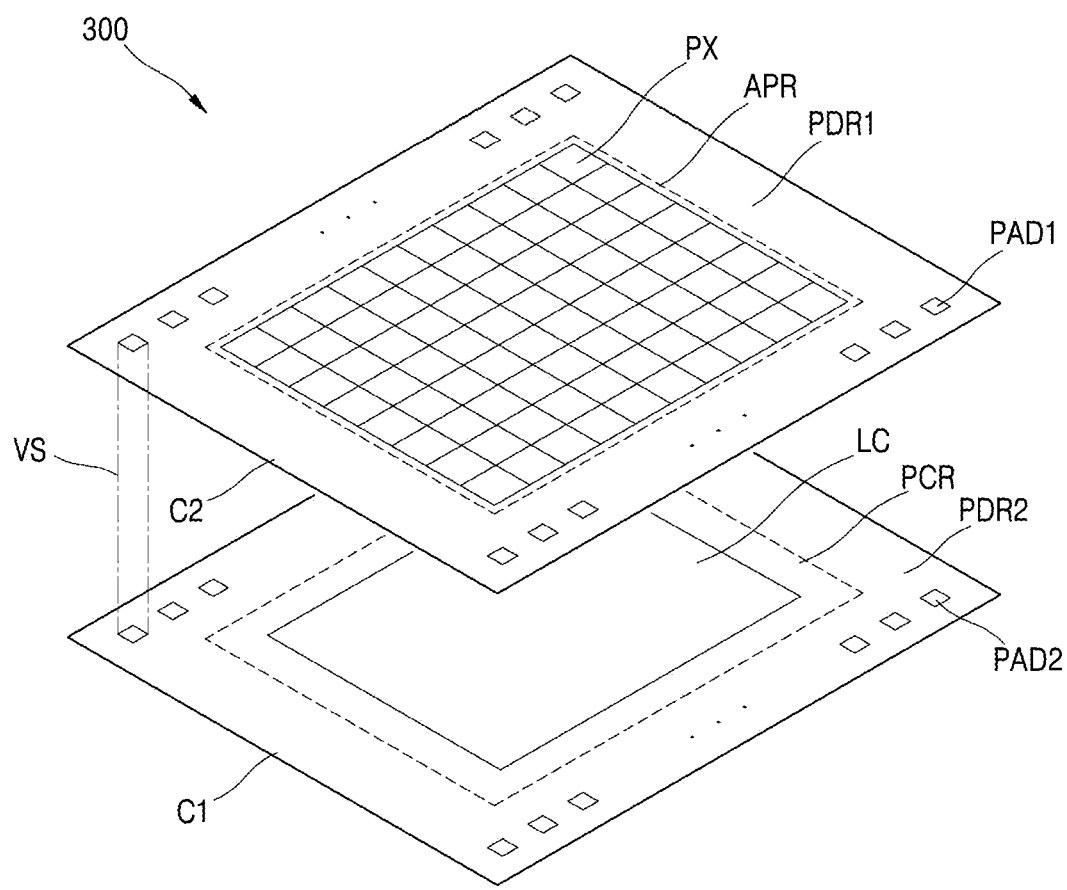
FIG. 17 is a schematic diagram of an image sensor according to some example embodiments.

FIG. 17 is a schematic diagram of an image sensor 300 according to some example embodiments.

Referring to FIG. 17, the image sensor 300 may be a stack image sensor in which a first chip C1 and a second chip C2 are stacked in a vertical direction. The first chip C1 may include an active pixel region APR and a first pad region PDR1, and the second chip C2 may include a peripheral circuit region PCR and a second pad region PDR2.

First pads PAD1 in the first pad region PDR1 may receive/transmit electrical signals from/to an external device, etc. The peripheral circuit region PCR may include a logic circuit block LC and CMOS transistors. In the peripheral circuit region PCR, signals may be uniformly provided to respective active pixels PX in the active pixel region APR, and output signals from respective active pixels PX may be controlled. The first pads PAD1 in the first pad region PDR1 may be electrically connected to second pads PAD2 in the second pad region PDR2 by via structures VS.

Figure 18:
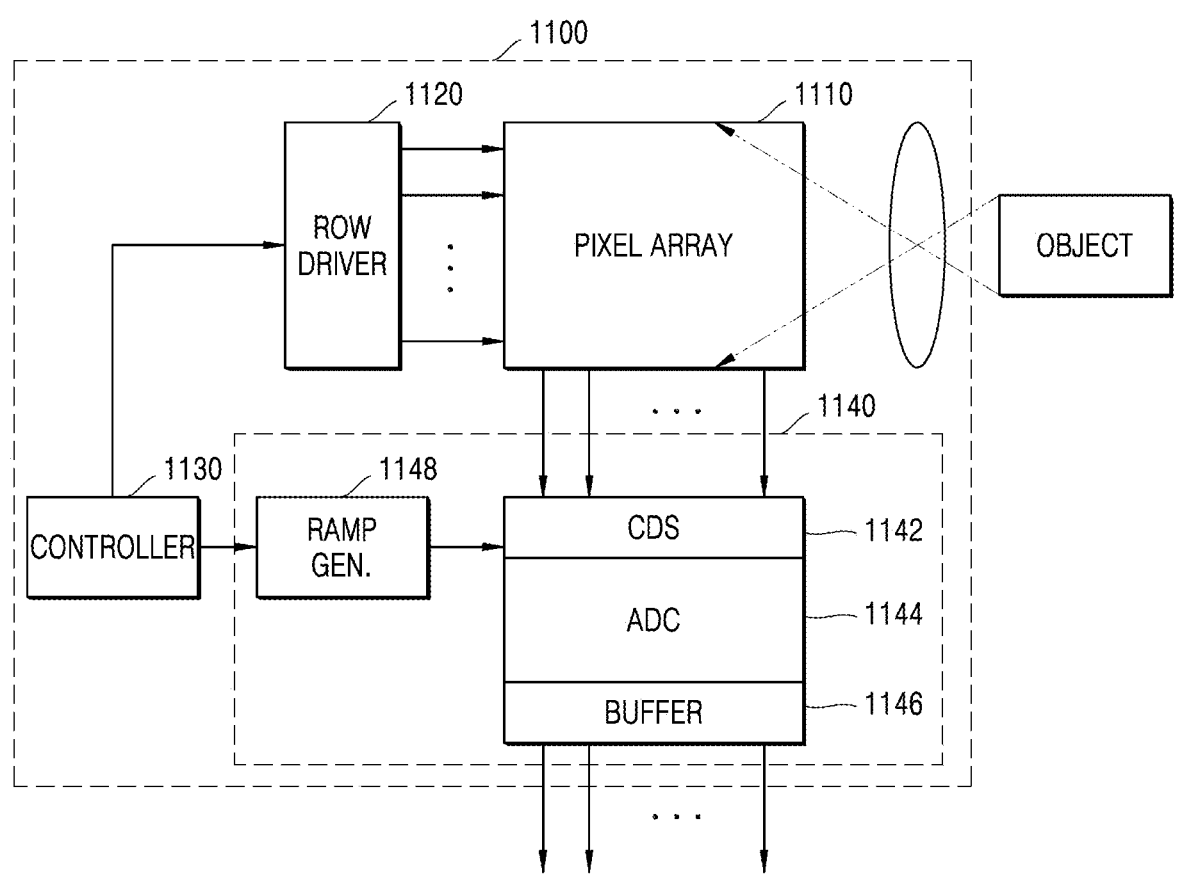
FIG. 18 is a block diagram of a configuration of an image sensor according to some example embodiments.

FIG. 18 is a block diagram of a configuration of an image sensor 1100 according to some example embodiments.

Referring to FIG. 18, the image sensor 1100 may include a pixel array 1110, a controller 1130, a row driver 1120, and a pixel signal processor 1140. The image sensor 1100 may include at least one of the image sensors 100, 100A, 100B, 100C, 100D, 200, 200A, 200B, and 300 described with reference to FIGS. 1 to 17.

The pixel array 1110 may include unit pixels that are two-dimensionally arranged, and each unit pixel may include an organic photoelectric conversion device. The organic photoelectric conversion device may generate charges by absorbing light, and electrical signals (output voltages) according to the generated charges may be provided to the pixel signal processor 1140 through vertical signal lines. The unit pixels included in the pixel array 1110 may provide the output voltages one by one in row units, and accordingly, the unit pixels included in one row of the pixel array 1110 may be simultaneously activated in response to selection signals output from the row driver 1120. The unit pixels included in the selected row may provide an output voltage according to the absorbed light to output lines of a corresponding column.

The controller 1130 may control the row driver 1120 to allow the pixel array 1110 to accumulate charges by absorbing light or temporarily store the accumulated charges, and to allow the electrical signals according to the stored charges to be output to the outside of the pixel array 1110. Also, the controller 1130 may control the pixel signal processor 1140 to measure the output voltages provided from the pixel array 1110.

The pixel signal processor 1140 may include a CDS 1142, an ADC 1144, and a buffer 1146. The CDS 1142 may sample and hold the output voltages provided from the pixel array 1110. The CDS 1142 may doubly sample a specific noise level and a level according to the generated output voltage and may output a level corresponding to a difference between the specific noise level and the level. Also, the CDS 1142 may receive and compare ramp signals generated by a ramp signal generator 1148 and may output a comparison result.

The ADC 1144 may convert, into a digital signal, an analog signal corresponding to the level received from the CDS 1142. The buffer 1146 may latch the digital signal, and the latched signal may be sequentially output to the outside of the image sensor 1100. Thus, the signals may be transmitted to an image processor (not shown).

The image sensor 1100 and/or any portions thereof (including, without limitation, the pixel array 1110, the controller 1130, the row driver 1120, the pixel signal processor 1140, the ramp signal generator 1148, the CDS 1142, the ADC 1144, the buffer 1146, any portion thereof, and/or any combination thereof) may include, may be included in, and/or may be implemented by one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device, for example a solid state drive (SSD), storing a program of instructions, and a processor (e.g., CPU) configured to execute the program of instructions to implement the functionality and/or methods performed by some or all of the image sensor 1100 and/or any portion thereof (including, for example, the controller 1130, the pixel signal processor 1140, and/or any combination thereof).

While the inventive concepts have been particularly shown and described with reference to some example embodiments thereof, it will be understood that various changes in form and details may be made therein without departing from the spirit and scope of the following claims.

What is claimed is:
1. An image sensor, comprising:
a substrate including a first surface and a second surface;
a first transmission gate electrode on the first surface of the substrate;
a storage node on the first surface of the substrate, the storage node including
a first storage gate electrode isolated from direct contact with the first transmission gate electrode,
a dielectric layer on the first storage gate electrode, and
a semiconductor layer on the dielectric layer;
a first cover insulating layer on the semiconductor layer, the first cover insulating layer overlapping the first transmission gate electrode in a vertical direction that extends perpendicular to the first surface of the substrate; and an organic photoelectric conversion layer on an upper surface of the semiconductor layer and an upper surface of the first cover insulating layer.

2. The image sensor of claim 1, wherein
the first transmission gate electrode overlaps a first portion of the semiconductor layer in the vertical direction, and
the first transmission gate electrode, the first portion of the semiconductor layer, and a first portion of the dielectric layer between the first transmission gate electrode and the first portion of the semiconductor layer in the vertical direction at least partially define a first transmission transistor.

3. The image sensor of claim 2, further comprising:
a floating diffusion region at least partially within the substrate,
wherein one end of the first transmission transistor is electrically connected to the storage node, and another end of the first transmission transistor is electrically connected to the floating diffusion region.

4. The image sensor of claim 3, wherein
the storage node further includes a second storage gate electrode isolated from direct contact with the first storage gate electrode, and
the image sensor further includes a second cover insulating layer on the semiconductor layer and the second storage gate electrode in the vertical direction.

5. The image sensor of claim 4, wherein
the second storage gate electrode is configured to form a potential gradient with the first storage gate electrode in response to
a first voltage being applied to the first storage gate electrode and a second voltage being applied to the second storage gate electrode independently of the first voltage being applied to the first storage gate electrode, the second voltage being different in magnitude than the first voltage, and
the first transmission transistor being turned on and photo-charges stored in the storage node being transmitted to the floating diffusion region.

6. The image sensor of claim 4, wherein
the first storage gate electrode includes a first side surface and a second side surface opposite to the first side surface,
the first transmission gate electrode is adjacent to the first side surface of the first storage gate electrode, and
the second storage gate electrode is adjacent to the second side surface of the first storage gate electrode.

7. The image sensor of claim 4, wherein, in a plan view, the second storage gate electrode surrounds at least two side surfaces of the first storage gate electrode.

8. The image sensor of claim 1, wherein, in a plan view, an area of the first storage gate electrode is two to a hundred times greater in magnitude than an area of the first transmission gate electrode.

9. The image sensor of claim 1, further comprising:
a drain terminal isolated from direct contact with the first storage gate electrode; and
a drain contact connecting the drain terminal to the semiconductor layer.

10. The image sensor of claim 9, wherein the drain terminal is configured to provide a current to the semiconductor layer to make the semiconductor layer function as a channel region of a phototransistor.

11. The image sensor of claim 1, further comprising:
a photoelectric conversion region in the substrate;
a second transmission gate electrode on the second surface of the substrate;
a floating diffusion region adjacent to the second transmission gate electrode in the substrate; and
a through via penetrating the substrate,
wherein the semiconductor layer is electrically connected to the floating diffusion region through the through via.

12. An image sensor, comprising:
a substrate including a first surface and a second surface;
a first transmission gate electrode on the first surface of the substrate;
a storage node on the first surface of the substrate, the storage node including
a first storage gate electrode isolated from direct contact with the first transmission gate electrode,
a dielectric layer on the first storage gate electrode, and
a semiconductor layer on the dielectric layer;
a cover insulating layer on the semiconductor layer, the cover insulating layer including one or more surfaces at least partially defining an opening in the cover insulating layer that overlaps the first storage gate electrode in a vertical direction that extends perpendicular to the first surface of the substrate and at least exposes the first storage gate electrode from the cover insulating layer in the vertical direction; and
an organic photoelectric conversion layer on the semiconductor layer and the cover insulating layer, the organic photoelectric conversion layer filling the opening of the cover insulating layer,
wherein the first transmission gate electrode is covered by the cover insulating layer.

13. The image sensor of claim 12, wherein the semiconductor layer and the cover insulating layer are between the first transmission gate electrode and the organic photoelectric conversion layer.

14. The image sensor of claim 12, wherein
the storage node further includes a second storage gate electrode isolated from direct contact with the first storage gate electrode,
the first storage gate electrode includes a first side surface and a second side surface opposite to the first side surface,
the first transmission gate electrode is adjacent to the first side surface of the first storage gate electrode, and
the second storage gate electrode is adjacent to the second side surface of the first storage gate electrode.

15. The image sensor of claim 14, wherein
the second storage gate electrode is overlapped with the cover insulating layer in the vertical direction, and
the semiconductor layer and the cover insulating layer are between the second storage gate electrode and the organic photoelectric conversion layer.

16. The image sensor of claim 14, wherein the storage node is configured to enable
a first voltage to be applied to the first storage gate electrode, and
a second voltage, which is different from the first voltage, to be applied to the second storage gate electrode independently of the first voltage being applied to the first storage gate electrode.

17. The image sensor of claim 12, wherein
the first transmission gate electrode overlaps a first portion of the semiconductor layer in the vertical direction, and
the first transmission gate electrode, the first portion of the semiconductor layer, and a first portion of the dielectric layer between the first transmission gate electrode and the first portion of the semiconductor layer in the vertical direction, at least partially define a first transmission transistor.

18. The image sensor of claim 12, further comprising:
a photoelectric conversion region in the substrate;
a second transmission gate electrode on the second surface of the substrate;
a floating diffusion region adjacent to the second transmission gate electrode in the substrate; and
a through via penetrating the substrate,
wherein the semiconductor layer is electrically connected to the floating diffusion region through the through via.

19. An image sensor, comprising:
a substrate including a first surface and a second surface;
a photoelectric conversion region in the substrate;
a first transmission gate electrode on the first surface of the substrate;
a storage node on the first surface of the substrate, the storage node including
 a first storage gate electrode isolated from direct contact with the first transmission gate electrode,
 a dielectric layer on the first storage gate electrode, and
 a semiconductor layer on the dielectric layer;
a cover insulating layer on the semiconductor layer, the cover insulating layer including one or more surfaces at least partially defining an opening in the cover insulating layer that overlaps the first storage gate electrode in a vertical direction that extends perpendicular to the first surface of the substrate and at least exposes the first storage gate electrode from the cover insulating layer in the vertical direction;
an organic photoelectric conversion layer on the semiconductor layer and the cover insulating layer, the organic photoelectric conversion layer filling the opening of the cover insulating layer; and
a second transmission gate electrode on the second surface of the substrate,
wherein the first transmission gate electrode does not overlap the opening of the cover insulating layer in the vertical direction.

20. The image sensor of claim 19, further comprising:
a second storage gate electrode disposed on the first surface of the substrate and isolated from direct contact with both of the first transmission gate electrode and the first storage gate electrode,
wherein the cover insulating layer contacts
 a first portion of the semiconductor layer, which is on the first transmission gate electrode, and
 a second portion of the semiconductor layer, which is on the second storage gate electrode.

* * * * *